United States Patent
Kim

(10) Patent No.: US 11,169,647 B2
(45) Date of Patent: Nov. 9, 2021

(54) INPUT SENSING CIRCUIT INCLUDING A PRESSURE SENSING PART AND A DISPLAY INCLUDING THE SAME

(71) Applicant: SAMSUNG DISPLAY CO., LTD., Yongin-si (KR)

(72) Inventor: Minsoo Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/791,921

(22) Filed: Feb. 14, 2020

(65) Prior Publication Data
US 2020/0264733 A1    Aug. 20, 2020

(30) Foreign Application Priority Data

Feb. 15, 2019 (KR) .................. 10-2019-0017654

(51) Int. Cl.
 *G06F 3/044* (2006.01)
 *G06F 3/041* (2006.01)
 *H01L 27/32* (2006.01)

(52) U.S. Cl.
 CPC .......... *G06F 3/0446* (2019.05); *G06F 3/0416* (2013.01); *H01L 27/323* (2013.01); *G06F 2203/04105* (2013.01)

(58) Field of Classification Search
 CPC ................ G06F 3/0446; G06F 3/0416; G06F 2203/04105; H01L 27/323
 See application file for complete search history.

(56) References Cited

U.S. PATENT DOCUMENTS

| | | | |
|---|---|---|---|
| 9,430,180 B2 | 8/2016 | Hirakata et al. | |
| 9,535,522 B2* | 1/2017 | Ahn | G09G 3/3208 |
| 9,619,070 B2 | 4/2017 | Amarilio et al. | |
| 10,139,974 B2 | 11/2018 | Hong et al. | |
| 2015/0091859 A1* | 4/2015 | Rosenberg | G06F 3/0445 |
| | | | 345/174 |
| 2018/0018044 A1* | 1/2018 | Hong | G06F 3/0414 |
| 2018/0284915 A1 | 10/2018 | Kim et al. | |
| 2018/0373408 A1* | 12/2018 | Lee | H04M 1/0266 |

FOREIGN PATENT DOCUMENTS

| | | |
|---|---|---|
| KR | 1020170040076 | 4/2017 |
| KR | 1020170140460 | 12/2017 |
| KR | 20180061680 | 6/2018 |
| KR | 101872250 | 7/2018 |

* cited by examiner

*Primary Examiner* — Christopher E Leiby
(74) *Attorney, Agent, or Firm* — F. Chau & Associates, LLC

(57) ABSTRACT

An input sensing circuit includes a base film. A plurality of first sensors are disposed on the base film. A plurality of second sensors are disposed on the base film. An input sensing driver is configured to sense a capacitance value between a first sensor of the plurality of first sensors and a second sensor of the plurality of second sensors. A pressure sensing part is in contact with the first sensor and the second sensor and includes a synthetic resin and a conductive material.

16 Claims, 19 Drawing Sheets

INPUT SENSING CIRCUIT INCLUDING A PRESSURE SENSING PART AND A DISPLAY INCLUDING THE SAME

CROSS-REFERENCE TO RELATED APPLICATION

This application claims priority under 35 U.S.C. § 119 to Korean Patent Application No. 10-2019-0017654 filed on Feb. 15, 2019, in the Korean Intellectual Property Office, the disclosure of which is incorporated by reference herein in its entirety.

TECHNICAL FIELD

The present invention relates to an input sensing circuit and a display device including the same, and more particularly, to an input sensing circuit including a pressure sensing part and a display device including the same.

DISCUSSION OF RELATED ART

Display devices are used in various multi-media devices such as a television, a mobile phone, a tablet computer, a navigation system, or a game console. The display devices used in multi-media devices include a keyboard and or a mouse as an input device.

Display devices may also include an input sensing circuit capable of sensing a touch of a user or a pressure applied by the user. In other words, the display device may include a touch screen display.

A display device may recognize a user's finger touching its screen through the input sensing circuit. The input sensing circuit senses a touch by using various techniques, for example: a resistive technique, an optical technique, a capacitive technique, or an ultrasonic technique. When the capacitive technique is employed, a touch is detected by using a capacitance that varies when a screen of the display device is touched by a portion of a user's body, a tool (e.g., a touch pen), etc.

SUMMARY

Exemplary embodiments of the present invention provide for an input sensing circuit including a pressure sensing part capable of sensing a pressure applied by a user, and a display device including the same.

According to an exemplary embodiment of the present invention, an input sensing circuit includes a base film. A plurality of first sensors are disposed on the base film. A plurality of second sensors are disposed on the base film. An input sensing driver is configured to sense a capacitance value between a first sensor of the plurality of first sensors and a second sensor of the plurality of second sensors. A pressure sensing part is in contact with the first sensor and the second sensor and includes a synthetic resin and a conductive material.

According to an exemplary embodiment of the present invention, the first sensor and the second sensor are adjacent to each other. When a pressure applied from the outside is equal to or greater than a predetermined value, the pressure sensing part electrically connects the first sensor and the second sensor disposed adjacent to each other. When the pressure applied from the outside is smaller than the predetermined value, the pressure sensing part electrically isolates the first sensor and the second sensor disposed adjacent to each other.

According to an exemplary embodiment of the present invention, the pressure sensing part is provided in plural, and the plurality of pressure sensing parts overlap sensors which are disposed on an outer side of the plurality of first sensors and the plurality of second sensors.

According to an exemplary embodiment of the present invention, the plurality of pressure sensing parts are disposed on the plurality of first sensors and the plurality of second sensors.

According to an exemplary embodiment of the present invention, a plurality of first connection parts are provided, each of which electrically connects two first sensors adjacent to each other from among the plurality of first sensors. A plurality of second connection parts are also provided, each of which electrically connects two second sensors adjacent to each other from among the plurality of second sensors. The pressure sensing part overlaps the first connection part of the plurality of first connection parts and the second connection part of the plurality of second connection parts.

According to an exemplary embodiment of the present invention, the pressure sensing part is interposed between the first connection part and the second connection part.

According to an exemplary embodiment of the present invention, each of the plurality of first sensors, the plurality of second sensors, the plurality of first connection parts, and the plurality of second connection parts, includes indium tin oxide (ITO) or indium zinc oxide (IZO).

According to an exemplary embodiment of the present invention, a plurality of openings are disposed in each of the plurality of first sensors, the plurality of second sensors, the plurality of first connection parts, and the plurality of second connection parts.

According to an exemplary embodiment of the present invention, the plurality of first sensors are arranged in a first direction and extend in a second direction perpendicular to the first direction, and the plurality of second sensors are arranged in the second direction.

According to an exemplary embodiment of the present invention, a first signal line electrically connects the first sensor and the input sensing driver. A second signal line electrically connects the second sensor and the input sensing driver. The input sensing driver determines whether a pressure has been applied by detecting a signal received through the first signal line and the second signal line.

According to an exemplary embodiment of the present invention, a first signal line electrically connects the first sensor of the plurality of first sensors and the input sensing driver. A second signal line electrically connects the second sensor of the plurality of second sensors and the input sensing driver. A first pressure sensing line electrically connects the pressure sensing part and the input sensing driver. A second pressure sensing line is spaced apart from the first pressure sensing line and electrically connects the pressure sensing part and the input sensing driver.

According to an exemplary embodiment of the present invention, a display device is provided including a main display surface parallel to a surface defined by a first direction and a second direction perpendicular to the first direction. A first sub-display surface extends along a first side of the main display surface. A second sub-display surface extends along a second side of the main display surface. A third sub-display surface extends along a third side of the main display surface. A fourth sub-display surface extends along a fourth side of the main display. A display panel including a plurality of light-emitting diodes. An input sensing circuit is disposed on the display panel. The input sensing circuit includes a plurality of sensors including a plurality of first sensors and a plurality of second sensors. A pressure sensing part is in contact with a first sensor of the plurality of first sensors and a second sensor of the plurality of second sensors. The pressure sensing part includes a synthetic resin and a conductive material and overlaps at least one of the first sub-display surface, the second sub-display surface, the third sub-display surface, and the fourth sub-display surface. An input sensing driver is configured to sense a capacitance value between the first sensor and the second sensor.

According to an exemplary embodiment of the present invention, at least one of the first sub-display surface, the second sub-display surface, the third sub-display surface and the fourth sub-display surface is curved on a third direction perpendicular to the first direction and the second direction.

According to an exemplary embodiment of the present invention, when a pressure applied from the outside is equal to or greater than a predetermined value, the pressure sensing part electrically connects the first sensor and the second sensor, and when the pressure applied from the outside is smaller than the predetermined value, the pressure sensing part electrically isolates the first sensor and the second sensor.

According to an exemplary embodiment of the present invention, the pressure sensing part is provided in plural and the plurality of pressure sensing parts are disposed on the plurality of first sensors and the plurality of second sensors.

According to an exemplary embodiment of the present invention, the input sensing circuit further includes a plurality of first connection parts, each of which electrically connects two first sensors adjacent to each other from among the plurality of first sensors, and a plurality of second connection parts, each of which electrically connects two second sensors adjacent to each other from among the plurality of second sensors. The pressure sensing part is provided in plural, and each of the plurality of pressure sensing parts overlaps any one first connection part of the plurality of first connection parts and any one second connection part of the plurality of second connection parts.

According to an exemplary embodiment of the present invention, the pressure sensing part is interposed between the first connection part and the second connection part.

According to an exemplary embodiment of the present invention, a plurality of openings are disposed in each of the plurality of first sensors, the plurality of second sensors, the plurality of first connection parts, and the plurality of second connection parts. The plurality of openings overlap the plurality of light-emitting diodes.

According to an exemplary embodiment of the present invention, the input sensing circuit further includes a first signal line that electrically connects the first sensor and the input sensing driver and a second signal line that electrically connects the second sensor and the input sensing driver. The input sensing driver determines whether a pressure has been applied, by using a signal received through the first signal line and the second signal line.

According to an exemplary embodiment of the present invention, the input sensing circuit further includes a first signal line that electrically connects the first sensor and the input sensing driver and a second signal line that electrically connects the second sensor and the input sensing driver. A first pressure sensing line electrically connects the pressure sensing part and the input sensing driver and a second pressure sensing line is spaced apart from the first pressure sensing line and electrically connects the pressure sensing part and the input sensing driver. The input sensing driver determines whether a pressure has been applied, by detecting a signal received through the first pressure sensing line or the second pressure sensing line.

BRIEF DESCRIPTION OF THE FIGURES

The above and other features of the present invention will become apparent by describing in detail exemplary embodiments thereof with reference to the accompanying drawings, in which.

DETAILED DESCRIPTION OF THE EMBODIMENTS

Exemplary embodiments of the present invention will now be described more fully hereinafter with reference to the accompanying drawings.

Figure 1A:
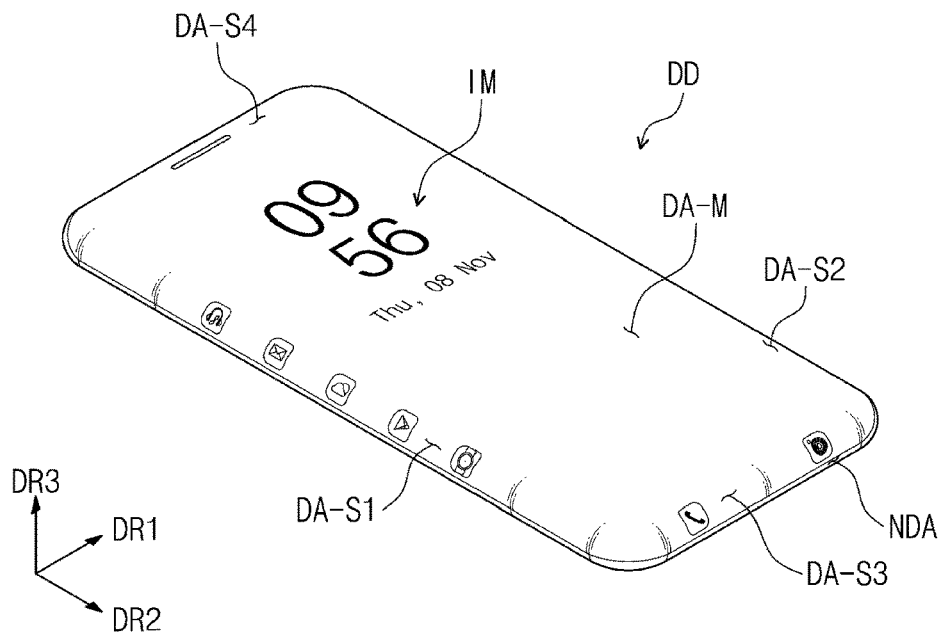
FIG. 1A is a perspective view illustrating a display device, according to an exemplary embodiment of the present invention.
Figure 1B:
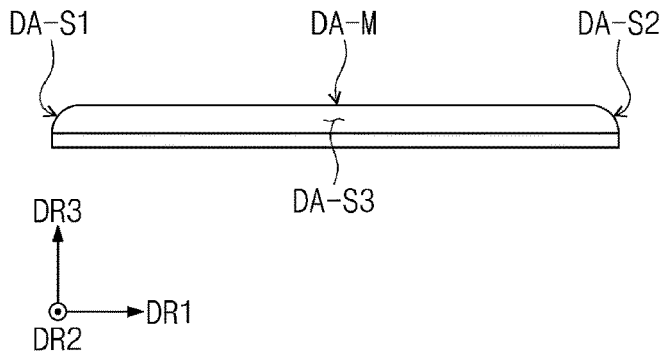
FIGS. 1B and 1C are side views illustrating shapes of a display device of FIG. 1A.
Figure 1C:
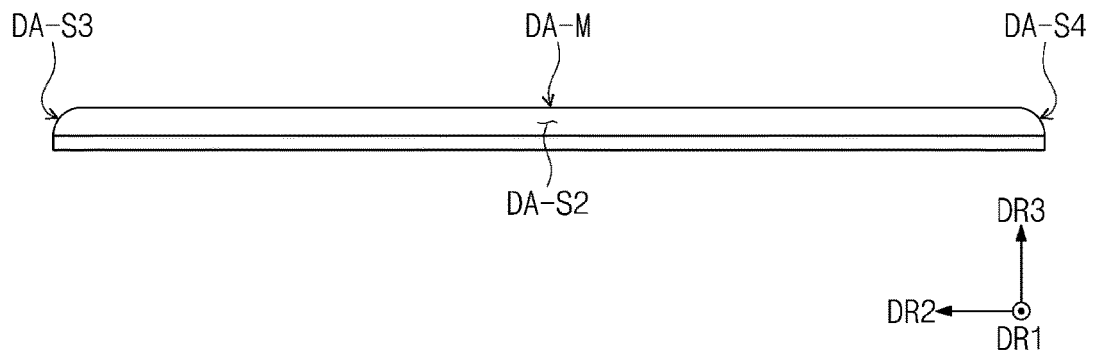

In drawings, proportions and dimensions of components may be exaggerated. FIG. 1A is a perspective view of a display device DD according to an exemplary embodiment of the present invention. FIGS. 1B and 1C are side views illustrating shapes of the display device DD of FIG. 1A.

An example is illustrated in FIGS. 1A to 1C in which the display device DD is represented as a smartphone. However, the present invention is not limited thereto. For example, the display device DD may be a small or medium-sized electronic device, such as a mobile phone, a tablet, a vehicle navigation system, a game console, or a smart watch, as well as a large-sized electronic device, such as a television or a monitor.

A display surface DA-M, DA-S1, DA-S2, DA-S3, DA-S4 may include a main display surface DA-M, a first sub-display surface DA-S1, a second sub-display surface DA-S2, a third sub-display surface DA-S3, and a fourth sub-display surface DA-S4.

The display surface DA-M, DA-S1, DA-S2, DA-S3, DA-S4 refers to a surface in which an image IM is displayed and a non-display surface NDA may be provided in the display device DD. A clock and an icon are illustrated in FIG. 1A as an example of the image IM.

The non-display surface NDA may correspond to an area where the image IM is not displayed. A bezel area of the display device DD may correspond to the non-display surface NDA.

The non-display surface NDA may surround the display surface DA-M, DA-S1, DA-S2, DA S3, DA-S4. However, the present invention is not limited thereto. For example, a shape of the display surface DA-M, DA-S1, DA-S2, DA-S3, DA-S4 may correspond to a shape of the non-display surface NDA.

The main display surface DA-M is parallel to a surface that is defined by a first direction (e.g., a DR1 direction) and a second direction (e.g., a DR2 direction). The normal direction of the main display surface DA-M, in other words, a thickness direction of the display device DD corresponds to a third direction (e.g., a DR3 direction). A front surface (also referred to as an upper surface) and a back surface (also referred to as a lower surface) of each member are spaced apart in the third direction e.g., the DR3 direction). However, directions that the first, second, and third directions DR1, DR2, and DR3 indicate may be relative and may be changed to different directions. Below, first to third directions that are directions respectively indicated by the first, second, and third direction axes DR1, DR2, and DR3 are marked by the same reference symbols.

The first sub-display surface DA-S1 may extend from a first side of the main display surface DA-M. The second sub-display surface DA-S2 may extend front a second side of the main display surface DA-M. The third sub-display surface DA-S3 may extend from a third side of the main display surface DA-M. The fourth sub-display surface DA-S4 may extend from a fourth side of the main display surface DA-M. For example, the first sub-display surface and the second sub-display surface DA-S1 and DA-S2 may refer to long sides of the display device DD, and the third sub-display surface and the fourth sub-display surface DA-S3 and DA-S4 may refer to short sides of the display device DD.

Each of the sub-display surfaces DA-S1, DA-S2, DA-S3 and DA-S4 may be curved to have a given curvature in the third direction (e.g., the DR3 direction).

The aesthetic sense of the display device DI) may be increased by the sub-display surfaces DA-S1, DA-S2, DA-S3, and DA-S4 having the given curvature, and the area of the non-display surface NDA that is perceivable by the user may be decreased.

Figure 2:
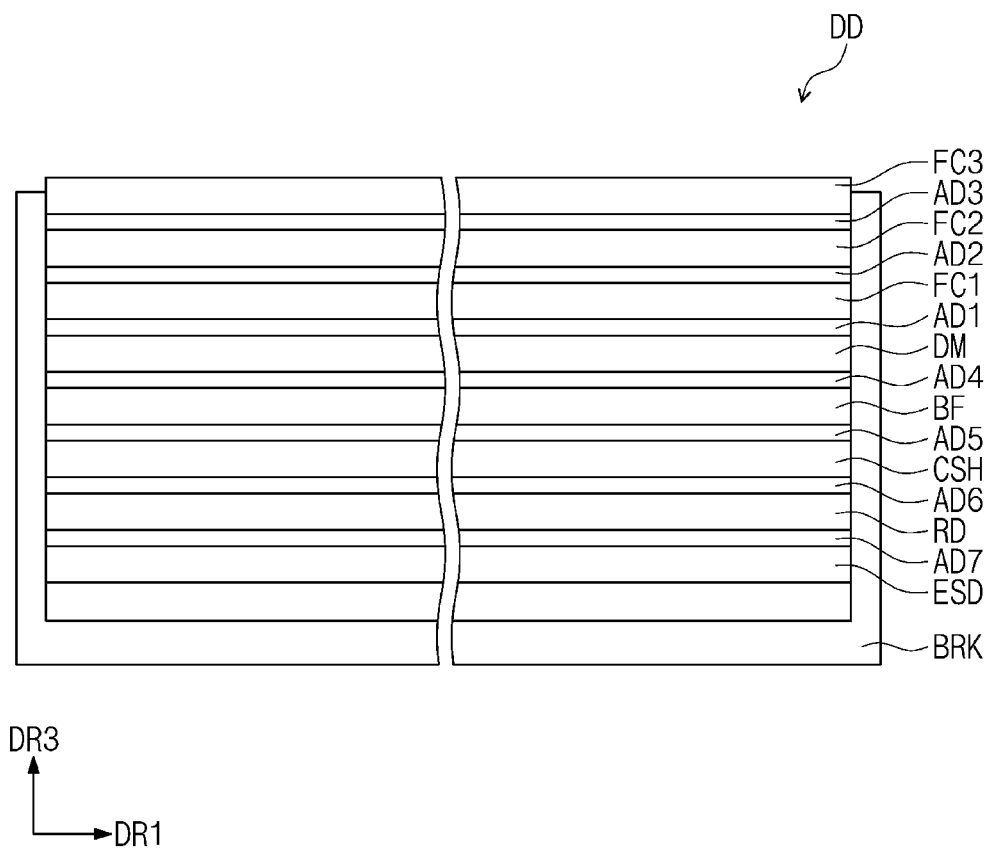
FIG. 2 is a cross-sectional view illustrating a display device, according to an exemplary embodiment of the present invention.
Figure 3A:
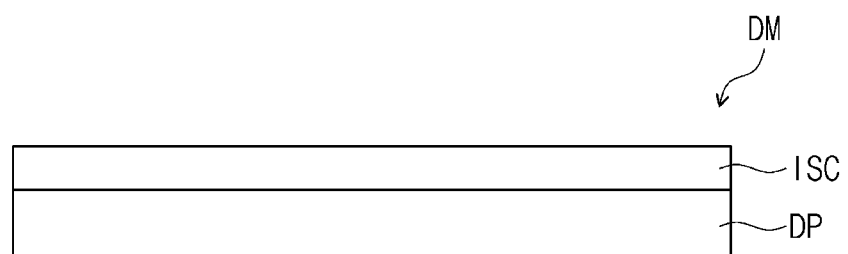
FIGS. 3A and 3B are cross-sectional views illustrating a display module illustrated in FIG. 2.
Figure 3B:
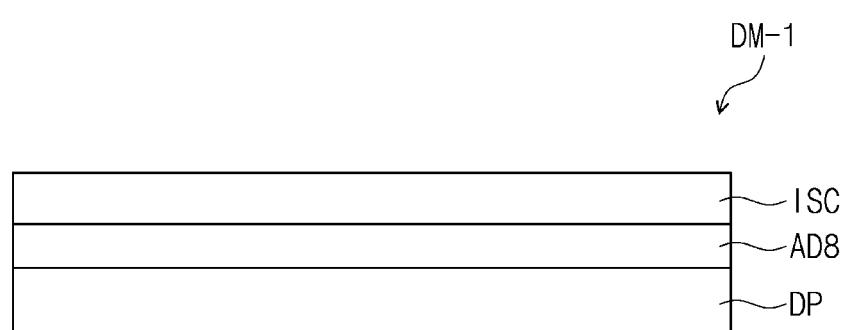

FIG. 2 is a cross-sectional view of the display device DD according to an exemplary embodiment of the present invention. FIG. 3A is a cross-sectional view of the display module DM of FIG. 2, and FIG. 3B is a cross-sectional view of a display module DM-1 according to an exemplary embodiment of the present invention. FIG. 2 shows a cross section defined by the first direction (e.g., the DR1 direction) and the third direction (e.g., the DR3 direction).

The display device DD may include the display module DM, a plurality of function layers FC1, FC2 and FC3, a base film BF, a shock absorbing member CSH, a radiation member RD, an electrostatic blocking member ESD, a bracket BRK, and a plurality of adhesive members AD1, AD2, AD3, AD4, AD5, AD6 and AD7.

In an exemplary embodiment of the present invention, each of the adhesive members AD1, AD2, AD3, AD4, AD5, A6 and AD7 may be a pressure sensitive adhesive (PSA).

The function layers FC1, FC2 and FC3 may be disposed over the display module DM.

The first function layer FC1 may be adhered to the display module DM by the first adhesive member AD1. The second function layer FC2 may be adhered to the first function layer FC1 by the second adhesive member AD2. The third function layer FC3 may be adhered to the second function layer FC2 by the third adhesive member AD3.

In an exemplary embodiment of the present invention, each of the function layers FC1, FC2 and FC3 may include a polymer material and/or glass. Each of the function layers FC1, FC2 and FC3 may be provided in the form of a film.

In an exemplary embodiment of the present invention, the first function layer FC1 may be a polarization function layer that polarizes incident light. The second function layer FC2 may be a shock absorbing function layer that absorbs a shock from the outside. The third function layer FC3 may be a window function layer that forms the exterior of the display device DD. In another embodiment of the present invention, at least one of the first to third function layers FC1, FC2 and FC3 may not be included.

The base film BF, the shock absorbing member CSH, the radiation member RD, and the electrostatic blocking member ESD are disposed under the display module DM in the third direction (e.g., the DR3 direction).

The base film BF may be disposed under the display module DM. The base film BF may be adhered to the display module DM by the fourth adhesive member AD4.

The base film BF may include a polymer material. In an exemplary embodiment of the present invention, the base film BF may have a black color.

The shock absorbing member CSH may be disposed under the base film BF. The shock absorbing member CSH may be adhered to a lower surface of the base film BF by the fifth adhesive member AD5.

The shock absorbing member CSH may include a polymer material. The shock absorbing member CSH may be a layer for absorbing a shock from the outside.

In an exemplary embodiment of the present invention, the shock absorbing member CSH may include thermoplastic polyurethane and/or foam rubber.

The radiation member RD may be disposed under the shock absorbing member CSH. The radiation member RD may be adhered to a lower surface of the shock absorbing member CSH by the sixth adhesive member AD6.

The radiation member RD may be a component for radiating heat generated in the display module DM to the outside. In an exemplary embodiment of the present invention, the radiation member RD may include a graphite and/or stainless material.

The electrostatic blocking member ESD may be disposed under the radiation member RD. The electrostatic blocking member ESD may be adhered to a lower surface of the radiation member RD by the seventh adhesive member AD7.

The electrostatic blocking member ESD may prevent the display module DM from being affected by static electricity exposure introduced from the outside. The electrostatic blocking member ESD may include metal. For example, the electrostatic blocking member ESD may include copper (Cu), iron (Fe), and/or aluminum (Al).

In an exemplary embodiment of the present invention, at least one of the base film BF, the shock absorbing member CSH, the radiation member RD, the electrostatic blocking member ESD, and the fourth to seventh adhesive members AD4 to AD7 might not be included.

The bracket BRK may fix or accommodate the display module DM, the shock absorbing member CSH, the radiation member RD, and the electrostatic blocking member ESD therein. According to an exemplary embodiment of the present invention, the bracket BRK may only partially overlap the third function layer FC3 in the first direction (e.g., the DR1 direction).

Referring to FIG. 3A, the display module DM may include a display panel DP and an input sensing circuit ISC. The input sensing circuit ISC may sense a touch and/or pressure that is applied from the outside.

The input sensing circuit ISC may be disposed directly on an encapsulation layer TFE (refer to FIG. 4) of the display panel DP. Here, the expression "disposed directly on" means that the input sensing circuit ISC is disposed on the display panel DP without an intervening adhesive member.

Referring to FIG. 3B, the display module DM-1 may include the display panel DP, the input sensing circuit ISC, and an eighth adhesive member AD8. The display panel DP and the input sensing circuit ISC may be adhered to each other by the eighth adhesive member AD8.

Figure 4:
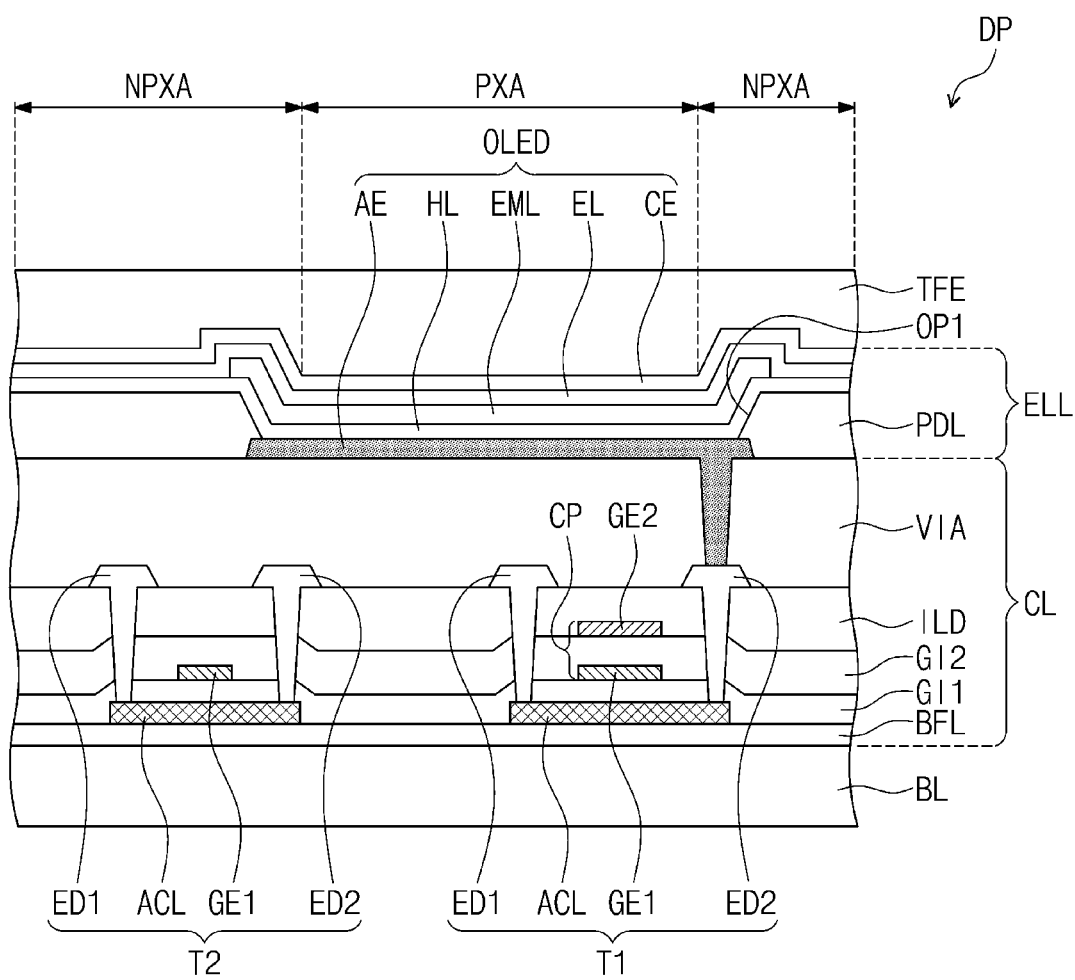
FIG. 4 is a cross-sectional view illustrating a portion of a display panel according to an exemplary embodiment of the present invention.

FIG. 4 is a cross-sectional view illustrating a portion of the display panel DP according to an exemplary embodiment of the present invention.

The display panel DP may include a base layer BL, a circuit layer CL, a light-emitting diode layer ELL, and the encapsulation layer TFE, for example, sequentially stacked.

The circuit layer CL may include a buffer layer BFL gate insulating layers GI1 and GI2, an interlayer insulating layer ILD, a circuit insulating layer VIA, for example, sequentially stacked. The circuit layer CL may also include transistors T1 and T2. Each of the buffer layer BFL, the gate insulating layers GI1 and GI2, the interlayer insulating layer ILD, and the circuit insulating layer VIA may include an organic material and or an inorganic material.

The light-emitting diode layer ELL may include an organic light-emitting diode OLED and a pixel definition layer PDL. The organic light-emitting diode OLED may include an anode electrode AE, a hole control layer HL, a light-emitting layer EML, an electron control layer EL, and a cathode electrode CE.

A first opening OP1 that is provided the pixel definition layer PDL may expose an upper surface of the anode electrode AE of the organic light-emitting diode OLED. The anode electrode AE may have a lower surface disposed on the circuit insulating layer VIA and may include a perpendicular portion connected to the first transistor T1 through an opening formed in the circuit insulating layer VIA. For example, the opening in the circuit insulating layer VIA may expose an upper surface of the second contact plug ED2 of the first transistor T1 and the perpendicular portion of the anode electrode AE may contact an upper surface of the second contact plug ED2 of the first transistor T1. The second contact plug ED2 may be connected to the first contact plug ED1 through an active layer ACL disposed on the buffer layer BFL. The first and second contact plugs ED1 and ED2 may both penetrate through the circuit layer CL in a thickness direction and contact an upper surface of the active layer ACL. A capacitor structure CP may be disposed between the first and second contact plugs ED1 and ED2. The capacitor structure CP may include a first and second gate electrode GE1 and GE2 spaced apart in a thickness direction. For example, the first gate electrode GE1 may be disposed on an upper surface of the gate insulating layer GI1, and the gate insulating layer GI2 may have a lower surface at least partially covering both the first gate electrode GE1 and the upper surface of the gate insulating layer GI1. The second gate electrode GE2 may have a lower surface disposed on an upper surface of the gate insulating layer GI2. The encapsulation layer TFE may seal (or encapsulate) the light-emitting diode layer ELL to protect the light-emitting diode layer ELL against external oxygen or moisture. The encapsulation layer TFE may be a layer in which an organic layer and an inorganic layer are mixed.

An area, through which light generated by the organic light-emitting diode OLED is emitted to the outside, of the display surface DA-M, DA-S1, DA-S2, DA-S3, DA-S4) may be defined as a pixel area PXA, and an area that is not the pixel area PXA may be defined as a non-pixel area NPXA.

The organic light-emitting diode OLED is exemplified in FIG. 4. However, the present invention is not limited thereto. For example, according to an exemplary embodiment of the present invention, the organic light-emitting diode OLED may be replaced with a micro light emitting diode (LED). In this case, a stacked structure of the display panel DP may be changed to correspond to a micro LED structure.

Figure 5:
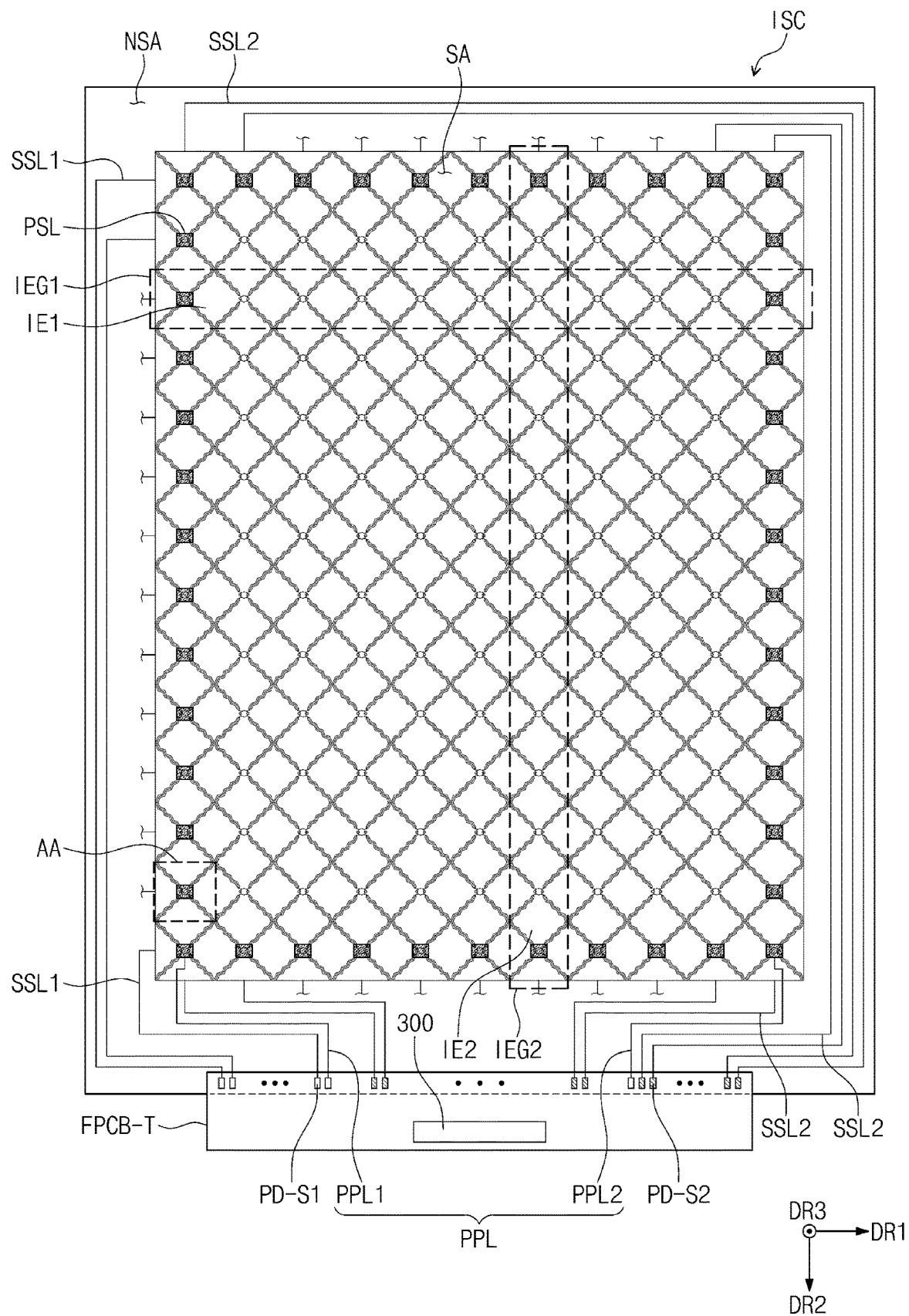
FIG. 5 is a plan view illustrating an input sensing circuit according to an exemplary embodiment of the present invention.
Figure 6A:
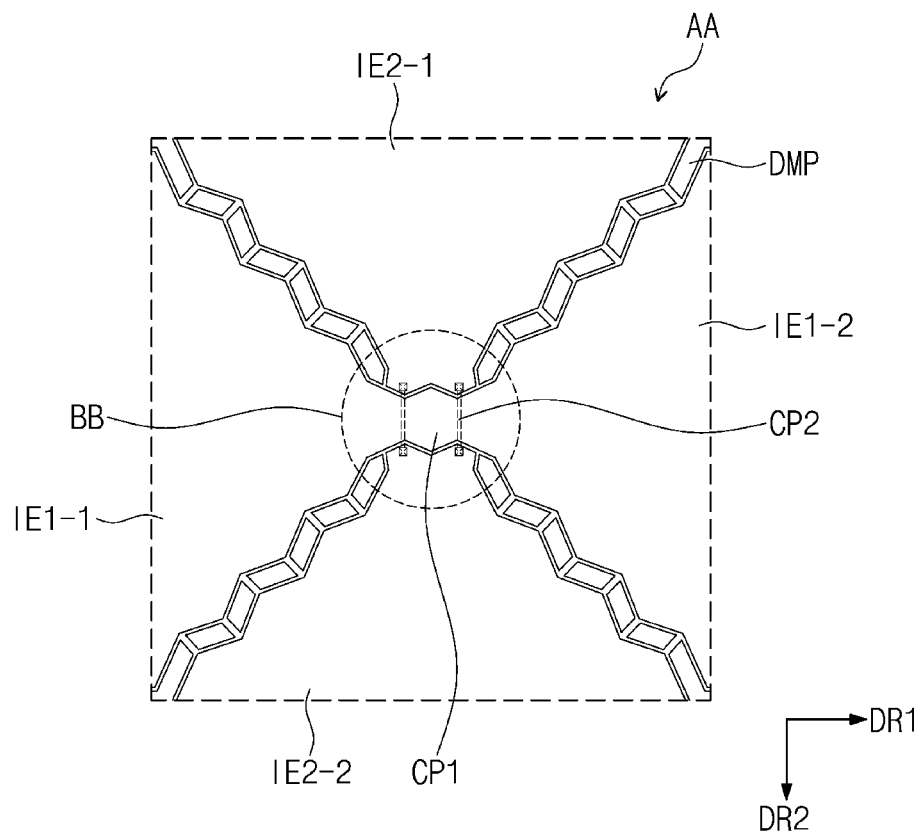
FIG. 6A is an enlarged view illustrating portion AA of FIG. 5.
Figure 6B:
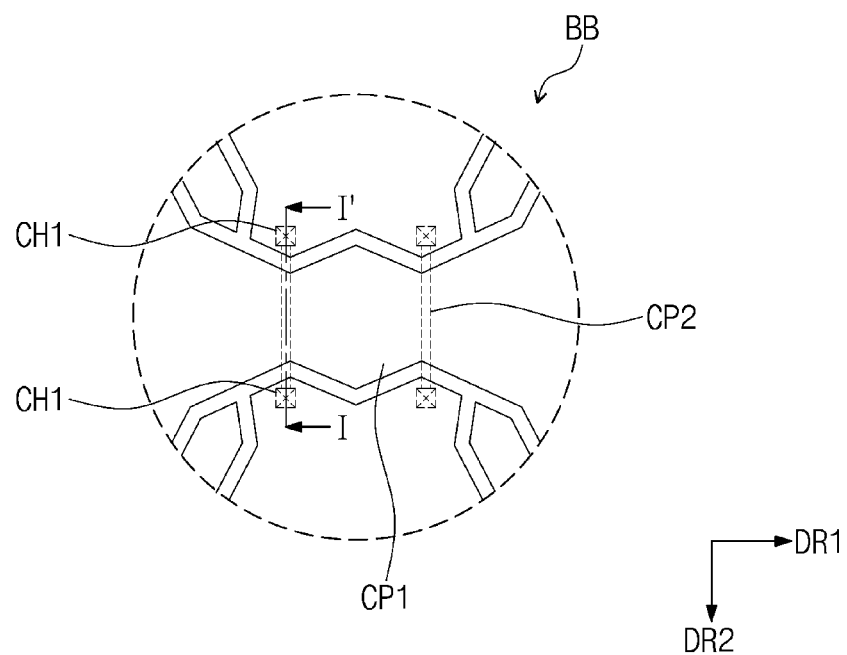
FIG. 6B is an enlarged view illustrating portion BB of FIG. 6A.
Figure 7A:
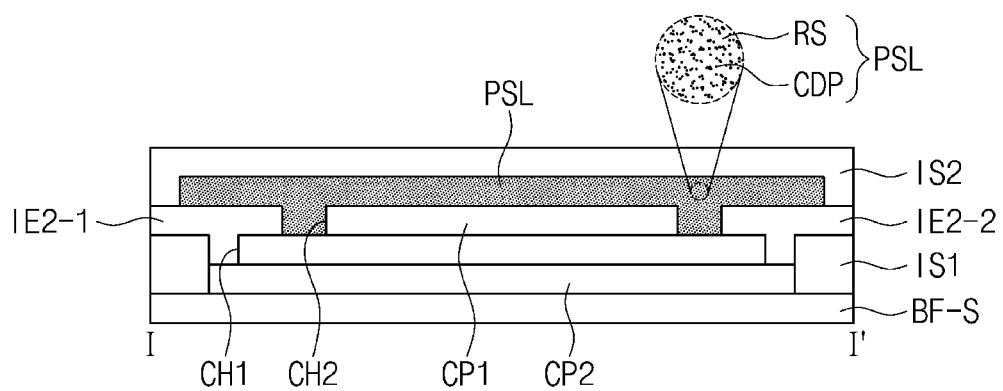
FIGS. 7A and 7B are cross-sectional views illustrating a cross section taken along a line I-I' of FIG. 6B, according to exemplary embodiments of the present invention.
Figure 7B:
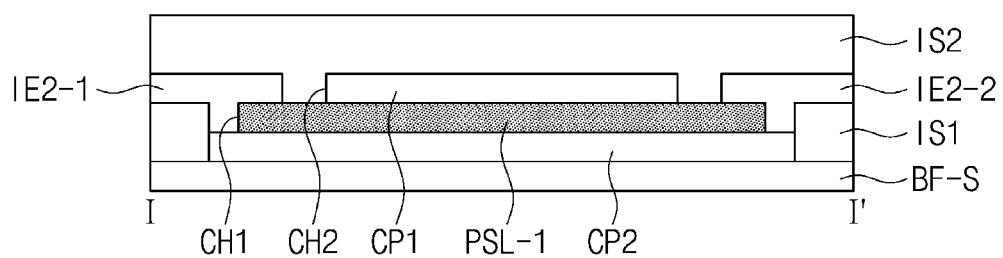

FIG. 5 is a plan view of the input sensing circuit ISC according to an exemplary embodiment of the present invention. FIG. 6A is an enlarged view of portion AA of FIG. 5. FIG. 6B is an enlarged view of portion BB of FIG. 6A. FIGS. 7A and 7B are cross-sectional views illustrating a portion of a cross section taken along a line I-I' of FIG. 6B.

An input sensing area SA that is capable of sensing an external input and a non-input sensing area NSA at least partially surrounding the input sensing area SA are provided in the input sensing circuit ISC.

The input sensing circuit ISC includes first sensor groups IEG1, second sensor groups IEG2, first connection parts CP1, second connection parts CP2, first signal lines SSL1, second signal lines SSL2, signal pads PD-S1 and PD-S2, a printed circuit board FPCB-T, an input sensing driver 300, and pressure sensing parts PSL. In an exemplary embodiment of the prose invention, as depicted in FIGS. 7A and 7B, the input sensing circuit ISC further includes a sensor-base film BF-S, a first insulating layer IS1, and a second insulating layer IS2.

Each of the first sensor groups IEG1 extends in the first direction e.g., the DR1 direction), and the first sensor groups IEG1 are arranged in the second direction (e.g., the DR2 direction). Each of the first sensor groups IEG1 includes first sensors IE1. The first sensors IE1 are arranged in the first direction (e.g., the DR1 direction), For example, the first sensor IE1 may be an Rx sensor.

Each of the second sensor groups IEG2 extend in the second direction (e.g., the DR2 direction), and the second sensor groups IEG2 are arranged in the first direction e.g., the DR1 direction). Each of the second sensor groups IEG2 include second sensors IE2. The second sensors IE2 are arranged in the second direction (e.g., the DR2 direction). For example, the second sensor IE2 may be a Tx sensor.

In an exemplary embodiment of the present invention, a length of the first sensor groups IEG1 measured in the first direction (e.g., the DR1 direction) may be shorter than a length of the second sensor groups IEG2 measured in the second direction the DR2 direction).

In an exemplary embodiment the present invention, each of the first sensors IE1 and the second sensors IE2 may include indium tin oxide (ITO) or indium zinc oxide (IZO). However, the present invention is not limited thereto. For example, each of the first sensors IE1 and the second sensors IE2 may include molybdenum (Mo), titanium (Ti) and/or aluminum (Al).

In an exemplary embodiment of the present invention, each of the first sensors IE1 may form a capacitance through capacitive coupling with second sensors IE2 adjacent to each of the first sensors IE1. The input sensing circuit ISC may sense variations in capacitance between the first sensors IE1 and the second sensors IE2 and may determine whether an input has been applied from the outside.

Referring to FIGS. 5 and 6A, dummy patterns DMP may be interposed between the first sensors IE1 and the second sensors IE2. The dummy patterns DMP may be spaced apart from the first sensors IE1 and the second sensors IE2. The dummy patterns DMP may be isolated from the first sensors IE1 and the second sensors IE2. A boundary area between the first sensors IE1 and the second sensors IE2 may not be visible to the user due to the arrangement of the dummy patterns DMP.

In an exemplary embodiment of the present invention, the dummy patterns DMP may include ITO and/or IZO. However, the present invention is not limited thereto. For example, each of the dummy patterns DMP may include Mo, Ti and/or Al.

The first signal lines SSL1 may be electrically connected to the first sensor groups IEG1, respectively. In an exemplary embodiment of the present invention, the first signal lines SSL1 may be electrically connected to the first sensor groups IEG1 in a single routing structure.

The second signal lines SSL2 may be electrically connected to the second sensor groups IEG2, respectively. In an exemplary embodiment of the present invention, the second signal lines SSL2 may be electrically connected to the second sensor groups IEG2 in a double routing structure.

In an exemplary embodiment of the present invention, each of the first signal lines SSL1 and the second signal lines SSL2 may include molybdenum (Mo), titanium (Ti) and/or aluminum (Al). However, the present invention is not limited thereto. For example, each of the first signal lines SSL1 and the second signal lines SSL2 may include ITO or IZO.

The pressure sensing parts PSL may be disposed to overlap sensors IE1 and IE2, which are disposed adjacent to the non-input sensing area NSA, from among the sensors IE1 and IE2. For example, the pressure sensing parts PSL may be disposed to overlap at least one of the sub-display surfaces DA-S1, DA-S2, DA-S3, and DA-S4 (refer to FIG. 1A).

Each of the pressure sensing parts PSL may include a conductive material and a synthetic resin. For example, the conductive material may include metal particles. In an exemplary embodiment of the present invention, a size of each of the metal particles may be a few nanometers (nm).

In an exemplary embodiment of the present invention, in the case where a pressure is applied from the outside, each of the pressure sensing parts PSL may have conductivity by the tunneling effect that occurs between metal particles.

In an exemplary embodiment of the present invention, in the case where a pressure is applied from the outside, each of the pressure sensing parts PSL may have conductivity through a contact between metal particles.

In an exemplary embodiment of the present invention, each of the pressure sensing parts PSL may include a pressure conductive rubber.

In an exemplary embodiment of the present invention, each of the pressure sensing parts PSL may include quantum tunneling composite (QTC).

In an exemplary embodiment of the present invention, each of the pressure sensing parts PSL may have conductivity only when a pressure applied from the outside is equal to or greater than a predetermined pascal (Pa) value, and may not have conductivity when the pressure applied from the outside is smaller than a predetermined Pa value.

The first signal pads PD-S1 are connected to the first signal lines SSL1. The second signal pads PD-S2 are connected to the second signal lines SSL2.

The printed circuit board FPCB-T is electrically connected to the signal pads PD-S1 and PD-S2.

The input sensing driver 300 is mounted on the printed circuit board FPCB-T. The input sensing driver 300 transmits/receives and/or processes an electrical signal for determining whether a touch of the user has been made in the input sensing area SA and whether a pressure has been applied.

The input sensing driver 300 senses the variation in capacitance between the sensors IE1 and IE2 by using the first signal lines SSL1 and the second signal lines SSL2.

In an exemplary embodiment of the present invention, the input sensing driver 300 may sense whether at least one of the first sensors IE1 and at least one of the second sensors IE2 have been electrically connected by the pressure sensing part PSL, by using the first signal lines SSL1 and the second signal lines SSL2. In an exemplary embodiment of the present invention, in the case where the input sensing driver 300 senses a current flowing between at least one of the first sensors IE1 and at least one of the second sensors IE2, or in the case where a capacitance sensed between at least one of the first sensors IE1 and at least one of the second sensors IE2 is "0", the input sensing driver 300 may sense that a pressure has been applied from the outside.

However, the present invention is not limited thereto. For example, the input sensing driver 300 may sense that a pressure is applied from the outside, by using pressure sensing lines PPL separately connected to respective pressure sensing parts PSL. The pressure sensing lines PPL may include a first pressure sensing line PPL1 and a second pressure sensing line PPL2 spaced apart from the first pressure sensing line PPL.

In an exemplary embodiment of the present invention, a driving timing for determining whether a touch has been made may be different from a driving timing for determining whether a pressure is applied at the input sensing driver 300. In the case where a signal for determining whether a touch has been made and a signal for determining whether a pressure has been applied are performed simultaneously, one signal may affect the other signal and thus the input sensing driver 300 does not make an accurate determination. However, the present invention is not limited thereto. In an exemplary embodiment of the present invention, a driving timing for determining whether a touch is made may be the same as a driving timing for determining whether a pressure is applied at the input sensing driver 300.

The portion AA of FIG. 5 illustrated in FIG. 6A is defined as a unit area AA in which the input sensing circuit ISC senses an external input. A left first sensor IE1-1, a right first sensor IE1-2, an upper second sensor IE2-1, and a lower second sensor IE2-2 are disposed in the unit area AA.

The first sensors IE1-1 and IE1-2 and the second sensors IE2-1 and IE2-2 may form a capacitance within the unit area AA.

The left first sensor IE1-1 and the right first sensor IE1-2 may be electrically connected by the first connection part CP1. The left first sensor IE1-1 the right first sensor IE1-2, the first connection part CP1 may be disposed in the same layer.

The upper second sensor IE2-1 and the lower second sensor IE2-2 may be electrically connected by the second connection part CP2. At least a portion of the second connection part CP2 may be disposed in a different layer from the upper second sensor IE2-1 and the lower second sensor IE2-2.

An electrostatic preventing pattern may be connected to each of the upper second sensor IE2-1 and the lower second sensor IE2-2. The electrostatic preventing pattern may induce static electricity to a vertex to prevent disconnection of the second connection part CP2.

Referring to FIGS. 7A and 7B, the second connection part CP2 may be disposed on the sensor-base film BF-S.

The first insulating layer IS1 may be disposed on the sensor-base film BF-S and may cover the second connection part CP2. For example, the first insulating layer IS1 may overlap the second connection part CP2 in (the second direction e.g., the DR2 direction). First contact holes CH1 may be provided in the first insulating layer IS1. For example, the first contact holes CH1 may expose an upper surface of the second connection part CP2. Second contact holes CH2 may refer to a gap with a width in the second direction (e.g., the DR2 direction) between ends of the upper second sensor IE2-1 and the lower second sensor IE2-2 and adjacent ends of the first connection part CP1. A first portion of each of the second sensors IE2-1 and IE2-2 and the first connection part CP1 may be disposed on the first insulating layer IS1. For example, the first portion of each of the second sensors IE2-1 and IE2-2 may have an end spaced apart from a respective end of the first connection part CP1 in the second direction (e.g., the DR2 direction), and may overlap a pressure sensing part PSL/PSL-1 in the thickness direction. The second connection part CP2 may be connected to the second sensors IE2-1 and IE2-2 through the first contact holes CH1. For example, a second portion of each of the second sensors IE2-1 and IE2-2 may orthogonally extend from the first portion in the thickness direction through respective first contact holes CH1 onto the upper surface of the second connection part CP2 and electrically connect thereto.

The pressure sensing part PSL may cover at least a portion of the first connection part CP1 and at least a portion of the second sensors IE2-1 and IE2-2. For example, referring to FIG. 7A, the pressure sensing part PSL may include a first portion extending in the second direction (e.g., the DR2 direction) and a second portion orthogonally extending therefrom in the thickness direction through second contact holes CH2 provided between ends of the second sensors IE2-1 and IE2-2 and adjacent ends of the first connection part CP1.

As described above, the pressure sensing part PSL may include a conductive material CDP and synthetic resin RS.

The second insulating layer IS2 may be disposed on the first insulating layer IS1 and may cover the second sensors IE2-1 and IE2-2, the first connection part CP1, and the pressure sensing part PSL.

Each of the first insulating layer IS1 and the second insulating layer IS2 may include an organic material and/or an inorganic material.

The sensor-base film BF-S illustrated in FIG. 7A may be replaced with the encapsulation layer TFE (refer to FIG. 4) of the display panel DP.

Referring to FIG. 7B, a pressure sensing part PSL-1 may be interposed between the first connection part CP1 and the second connection part CP2. The pressure sensing part PSL-1 may extend in the second direction (e.g., the DR2 direction). For example, ends of the pressure sensing part PSL-1 may be disposed at adjacent sidewalls of the first contact hole CH1. A layer in which the pressure sensing part PSL-1 illustrated in FIG. 7B is disposed may be different from a layer in which the pressure sensing part PSL illustrated in FIG. 7A is disposed. The first and second ends of the pressure sensing part PSL-1 may correspond to a space provided between the first and second portions of the second sensors IE2-1 and IE2-2.

Figure 8A:
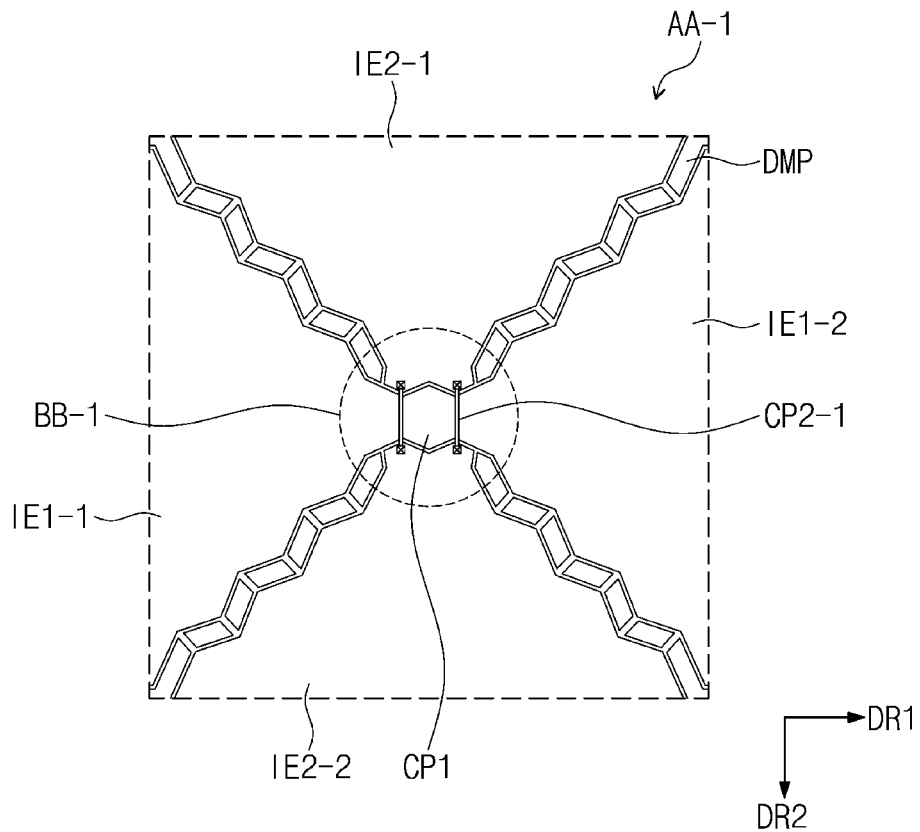
FIG. 8A is an enlarged view illustrating portion AA of FIG. 5, according to an exemplary embodiment of the present invention.
Figure 8B:
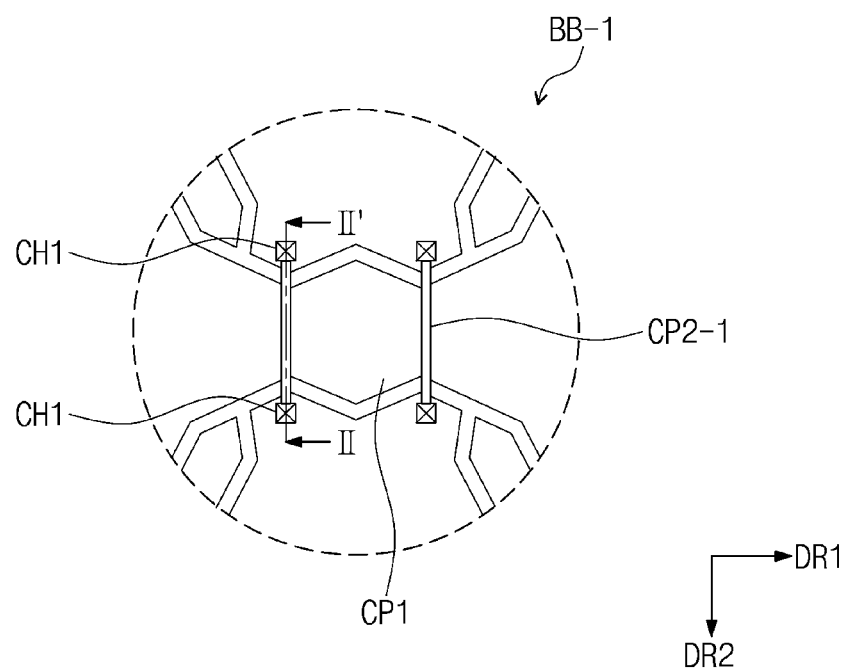
FIG. 8B is an enlarged view of portion BB-1 of FIG. 8A.
Figure 9:
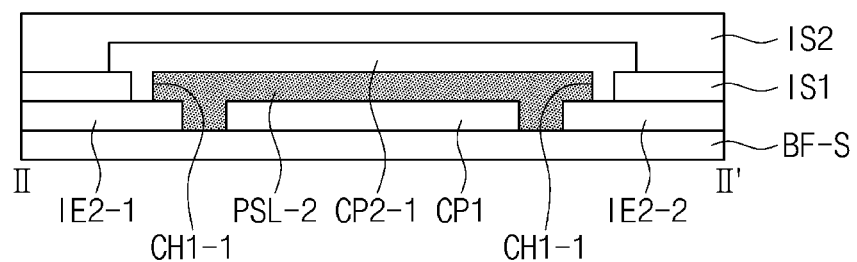
FIG. 9 is a cross-sectional view illustrating a cross section taken along a line II-II' of FIG. 8B.

FIG. 8A is a modified embodiment of the embodiment of FIG. 6A. FIG. 8B is an enlarged view of portion BB-1 of FIG. 8A. FIG. 9 is a cross-sectional view illustrating a portion of a cross section taken along a line II-II' of FIG. 8B.

Unlike the embodiments illustrated in FIGS. 6A to 7B, in an exemplary embodiment illustrated in FIGS. 8A to 9, a second connection part CP2-1 may be disposed in a higher layer than the first connection part CP1, for example, in the thickness direction. For example, the second connection part CP2-1 may have first portions that extend in a second direction (e.g., the DR2 direction) and second portions orthogonally extending from corresponding first portions in the thickness direction onto an upper surface of the second sensors IE2-1 and IE2-2.

In detail, referring to FIG. 9, the first connection part CP1 and the second sensors IE2-1 and IE2-2 may be disposed on the sensor-base film BF-S.

A pressure sensing part PSL-2 may be disposed on the sensor-base film BF-S and may cover at least a portion of the first connection part CP1 and at least a portion of the second sensors IE2-1 and IE2-2. The pressure sensing part PSL-2 may be disposed between the second connection part CP2-1 and the first connection part CP1 in the thickness direction. For example, the pressure sensing part PSL-2 may include a first portion extending in the second direction (e.g., the DR2 direction) and overlapping the second sensors IE2-1 and IE2-2 and the first connection part CP1 in the thickness direction, and a second portion extending orthogonally from the first portion in the thickness direction onto the sensor-base film BF-S.

The first insulating layer IS1 may be disposed in the same layer as the pressure sensing part PSL-2.

First contact holes CH1-1 may be provided between the first insulating layer IS1 and the pressure sensing part PSL-2.

The second connection part CP2-1 may be disposed on the first insulating layer IS1 and the pressure sensing part PSL-2. The second connection part CP2-1 may be connected to the second sensors IE2-1 and IE2-2 through the first contact holes CH1-1. For example, the second portions of the second connection part CP2-1 may be disposed in the first contact holes CH1-1.

The second insulating layer IS2 may be disposed on the first insulating layer IS1 and may cover the second connection part CP2-1. For example, the second insulating layer IS2 may overlap an upper surface and sidewalls of the first portion of the second connection part CP2-1 and an upper surface of the first insulating layer IS1.

Figure 10:
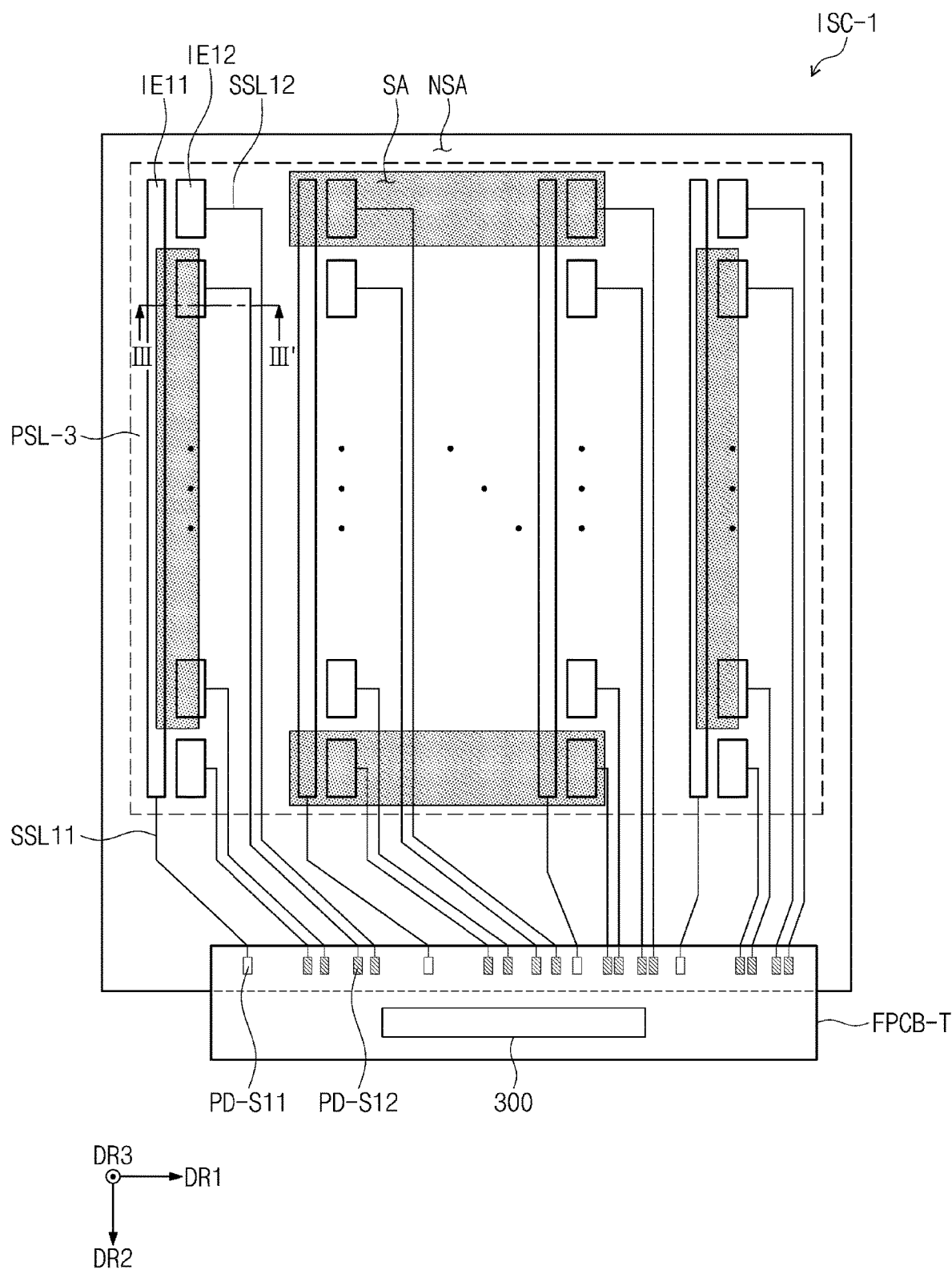
FIG. 10 is a plan view of an input sensing circuit, according to an exemplary embodiment of the present invention.
Figure 11:
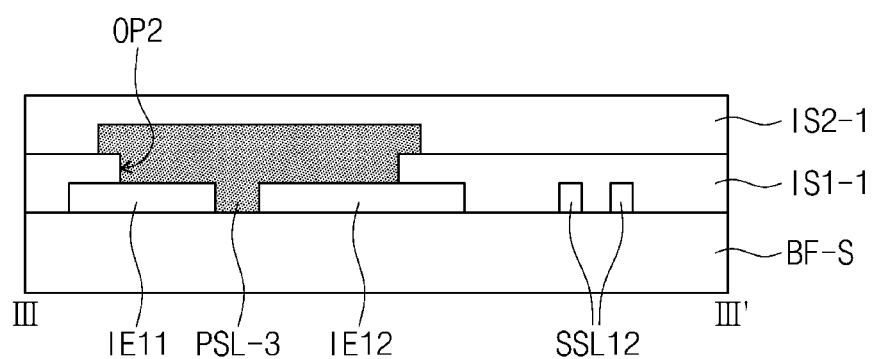
FIG. 11 is a cross-sectional view illustrating a portion of a cross section taken along a line III-III' of FIG. 10.

FIG. 10 is a plan view of an input sensing circuit ISC-1 according to an exemplary embodiment of the present invention. FIG. 11 is a cross-sectional view illustrating a portion of a cross section taken along a line III-III' of FIG. 10.

The input sensing circuit ISC may include first sensors second sensors IE12, first signal lines SSL11, second signal lines SSL12, first signal pads PD-S11, second signal pads PD-S12, the printed circuit board FPCB-T, the input sensing driver 300, and pressure sensing parts PSL-3. In an exemplary embodiment of the present invention, the input sensing circuit ISC may further include the sensor-base film BF-S, a first insulating layer IS1-1, and a second insulating layer IS2-1. The first signal lines SSL11 and the second signal lines SSL12 may also be referred to as pressure sensing lines herein.

The first sensors IE11 may be arranged in the first direction (e.g., the DR1 direction). Each of the first sensors IE11 may extend in the second direction (e.g., the DR2 direction).

The second sensors IE12 may be disposed adjacent to a corresponding first sensor IE11 of the first sensors IE11. In this structure, a plurality of second sensors IE12 may be disposed adjacent to at least one of the first sensors IE11.

The first signal lines SSL11 may be respectively connected to the first sensors IE11, and the second signal lines SSL12 may be respectively connected to the second sensors IE12.

The first signal pads PD-S11 may be respectively connected to the first signal lines SSL11, and the second signal pads PD-S12 may be respectively connected to the second signal lines SSL12.

The printed circuit board FPCB-T may be electrically connected to the signal pads PD-S11 and PD-S12.

The input sensing driver 300 may be mounted on the printed circuit board FPCB-T.

The input sensing driver 300 may sense the variation in a capacitance between the first sensors IE11 and the second sensors IE12.

The pressure sensing parts PSL-3 mays be disposed to overlap sensor IE11 and IEI2, which are disposed adjacent to the non-input sensing area NSA, from among the sensors IE11 and IE12. The pressure sensing parts PSL-3 may be disposed to overlap at least one of the sub-display surfaces DA-S1, DA-S2, DA-S3, and DA-S4 (refer to FIG. 1A).

Referring to FIGS. 10 and 11, the first sensors IE11, the second sensors IE12, the first signal lines SSL11, and the second signal lines SSL12 may be disposed on the sensor-base film BF-S.

The first insulating layer IS1-1 may be disposed on the sensor-base film BF-S and may cover the first sensors IE11, the second sensors IE12, the first signal lines SSL11, and the second signal lines SSL12.

A second opening OP2 may be provided in the first insulating layer IS1-1. A pressure sensing part PSL-3 may be disposed in and correspond to the second opening OP2. The pressure sensing part PSL-3 may cover at least a portion of the first sensor IE11 and at least a portion of the second sensor IE12 (e.g., upper surfaces in the thickness direction).

The second insulating layer IS2-1 may be disposed on the first insulating layer IS1-1 and may cover the pressure sensing part PSL-3, for example, in the thickness direction.

Figure 12:
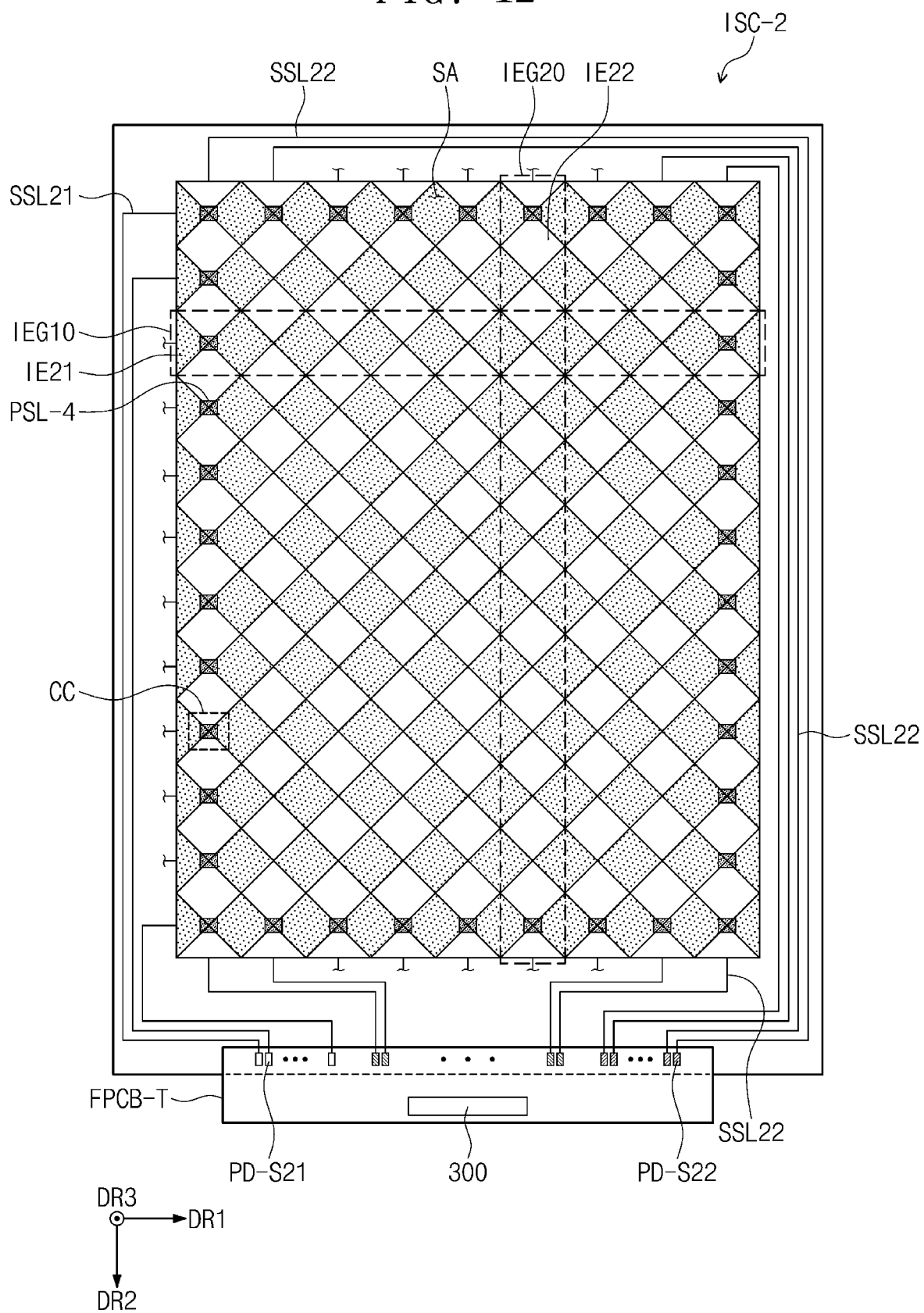
FIG. 12 is a plan view of a display device according to an exemplary embodiment of the present invention.

FIG. 12 is a plan view of an input sensing circuit ISC-2 according to an exemplary embodiment of the present invention.

The input sensing circuit ISC-2 may include first sensor groups IEG10, second sensor groups IEG20, first signal lines SSL21, second signal lines SSL22 signal pads PD-S21 and PD-S22, the printed circuit board FPCB-T, the input sensing driver 300, and a plurality of pressure sensing parts PSL-4.

Each of the first sensor groups IEG10 may include first sensors IE21. Each of the second sensor groups IEG20 may include second sensors IE22.

A plane of the input sensing circuit ISC-2 illustrated in FIG. 12 is substantially the same as the plane of the input sensing circuit ISC illustrated in FIG. 5, and thus, additional description will be omitted to avoid redundancy.

Figure 13:
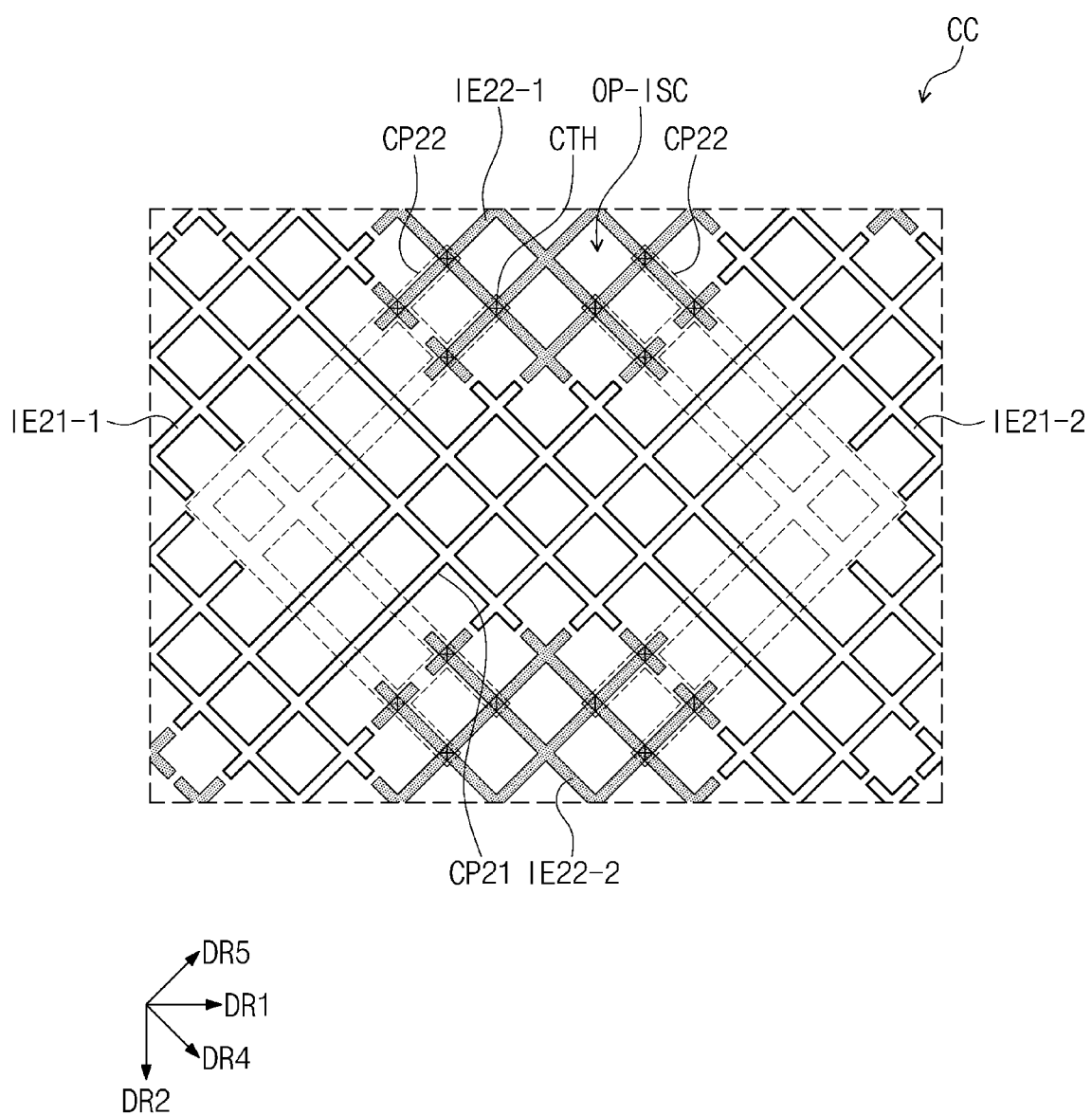
FIG. 13 is an enlarged view of area CC of FIG. 12.

FIG. 13 is an enlarged view of area CC of FIG. 12, FIGS. 14A, 14B, and 14C are enlarged views illustrating layers of the area CC of FIG. 12.

Figure 14A:
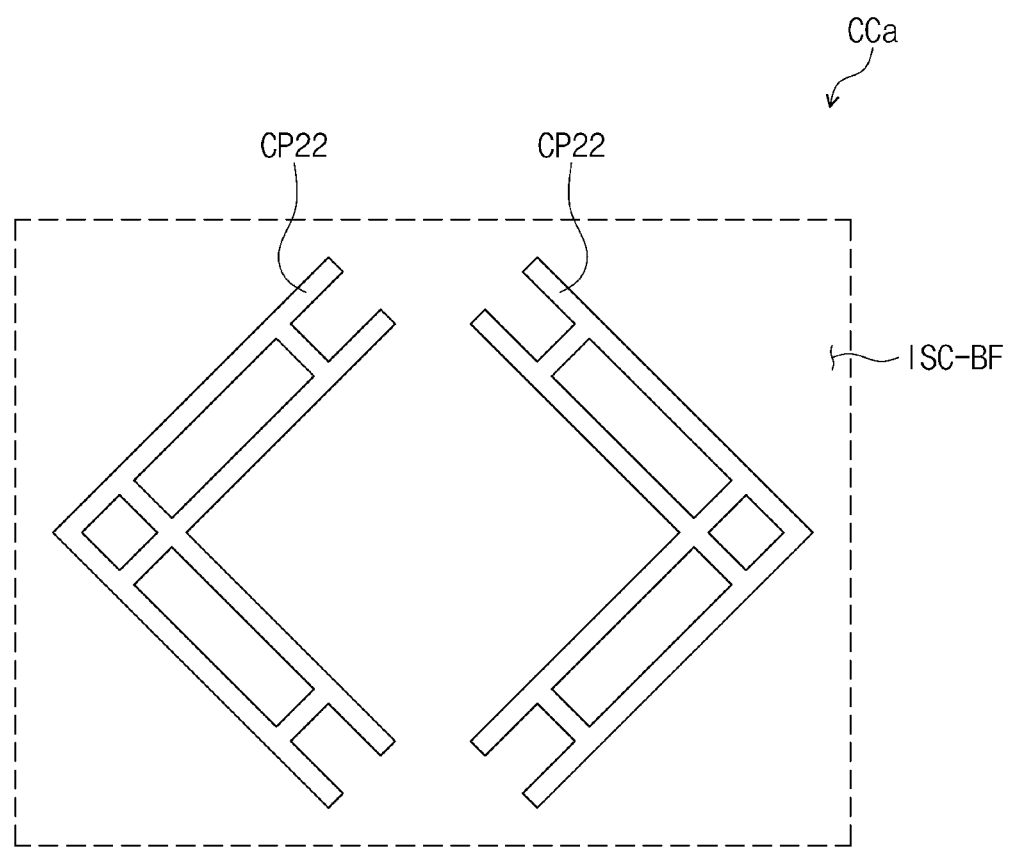
FIGS. 14A, 14B, and 14C are enlarged views illustrating layers of the area CC of FIG. 12.

Referring to FIG. 14A, second connection parts CP22 may be disposed on a silicon-buffer layer ISC-BF. The second connections parts CP22 may include two portions spaced apart in the first direction e.g., the DR1 direction).

The second connection parts CP22 may electrically connect two adjacent sensors of the second sensors IE22 (refer to FIG. 12).

Figure 14B:
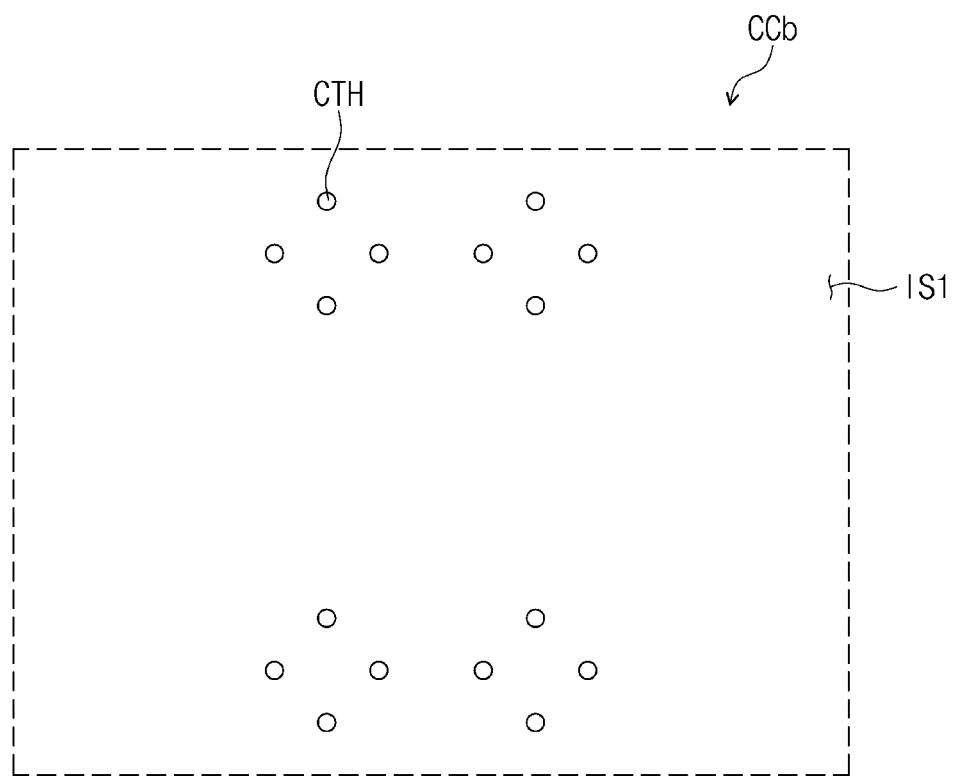

Referring to FIG. 14B, a plurality of contact holes CTH may be provided in the first insulating layer IS1. The contact holes CTH may expose a part of the second connection parts CP22. In detail, the contact holes CTH may expose opposite ends of the second connection parts CP22. For example, opposite ends of the second connection parts CP22 may refer to ends separated in the second direction (e.g., the DR2 direction).

16 contact holes CTH are exemplified in FIG. 14, but the present invention is not limited thereto. For example, the number of the contact holes CTH may be variously changed.

Figure 14C:
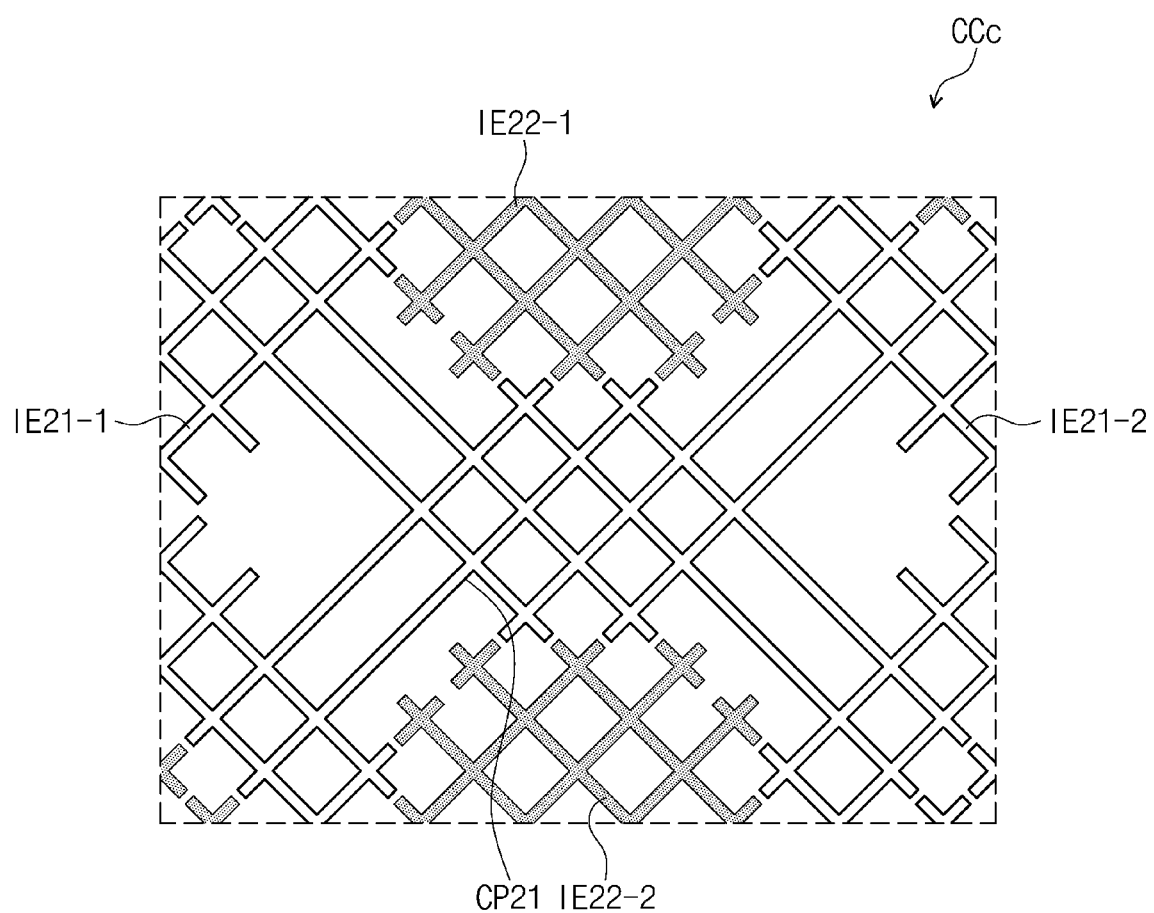

Referring to FIG. 14C, the first sensors IE21-1 and IE21-2, the second sensors IE22-1 and IE22-2, and first connection parts CP21 may be disposed on the first insulating layer IS1.

The left first sensor IE21-1 and the right first sensor IE21-2 may be electrically connected by the first connection part CP21.

The upper second sensor IE22-1 and the lower second sensor IE22-2 may be electrically connected, to the second connection part CP22 through the contact boles CTH of the first insulating layer IS1.

Returning to FIG. 13, a direction between the first direction (e.g., the DR1 direction) and the second direction (e.g., the DR2 direction) may be defined as a fourth direction (e.g., a DR4 direction). A fifth direction (e.g., a DR5 direction) may be defined as a direction perpendicular to the fourth direction (e.g., the DR4 direction). For example, the fourth direction (e.g., the DR4 direction) may form 45 degree angles with each of the first direction (e.g., the DR1 direction) and the second direction (e.g., the DR2 direction). The fifth direction e.g., the DR5 direction) may form a 45 degree angle with the first direction (e.g., the DR1 direction) and may form a 135 degree angle with the second direction (e.g., the DR2 direction).

In the area CC, wires for the first sensors IE21-1 and IE21-2, the second sensors IE22-1 and IE22-2, the first connection part CP21, and the second connection part CP22 may extend in the fourth direction e.g., the DR4 direction) and/or the fifth direction (e.g., the DR5 direction).

In the area CC, a plurality of touch-openings OP-ISC may be provided between the wires for the first sensors IE21-1 and IE21-2, the second sensors IE22-1 and IE22-2, the first connection part CP21, and the second connection part CP22.

In an exemplary embodiment of the present invention, each of the touch-openings OP-ISC may correspond to the pixel area PXA (refer to FIG. 4).

Each of the touch-openings OP-ISC may transmit a light that the organic light-emitting diode OLED (refer to FIG. 4) generates. That is, the touch-opening OP-ISC may overlap the anode electrode AE of the organic light-emitting diode OLED (refer to FIG. 4). As such, a light that is generated by the organic light-emitting diode OLED (refer to FIG. 4) may be emitted to the outside through the touch-opening OP-ISC.

Figure 15:
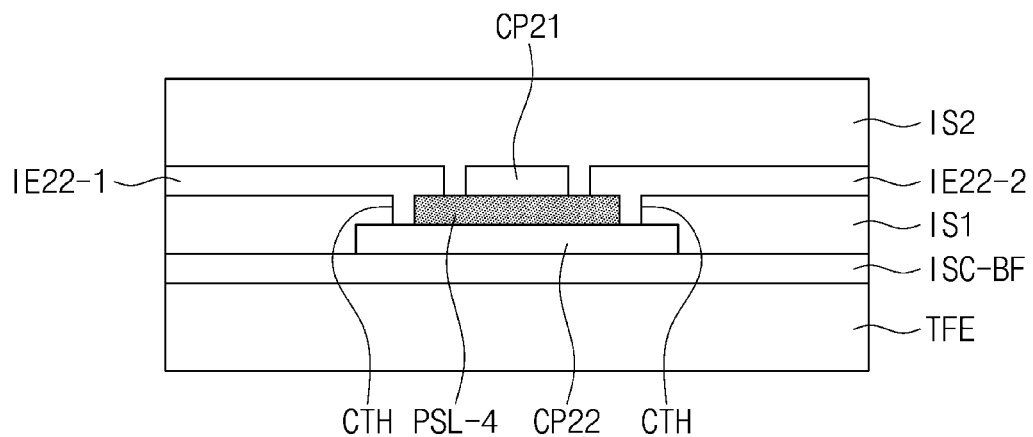
FIGS. 15 and 16 are cross-sectional views illustrating a portion of a cross section of a display module, according to an exemplary embodiment of the present invention.
Figure 16:
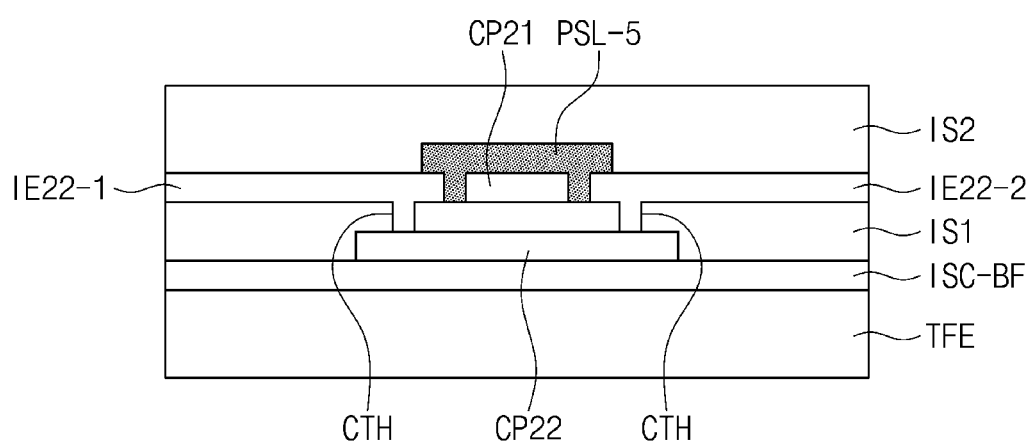

FIGS. 15 and 16 are cross-sectional views illustrating a portion of a cross section of the display module DM (refer to FIG. 3A), according to an exemplary embodiment of the present invention.

Referring to FIGS. 4 and 15, in an exemplary embodiment of the present invention, a pressure sensing part PSL-4, may be interposed between the first connection part CP21 and the second connection part CP22. For example, the pressure sensing part PSL-4 may be disposed in the same layer as the first insulating layer IS1.

Referring to FIGS. 4 and 16, in an exemplary embodiment of the present invention, a pressure sensing part PSL-5 may be disposed on at least a part of the first connection part CP21 and the second sensors IE22-1 and IE22-2 so as to cover the at least a part thereof.

Figure 17:
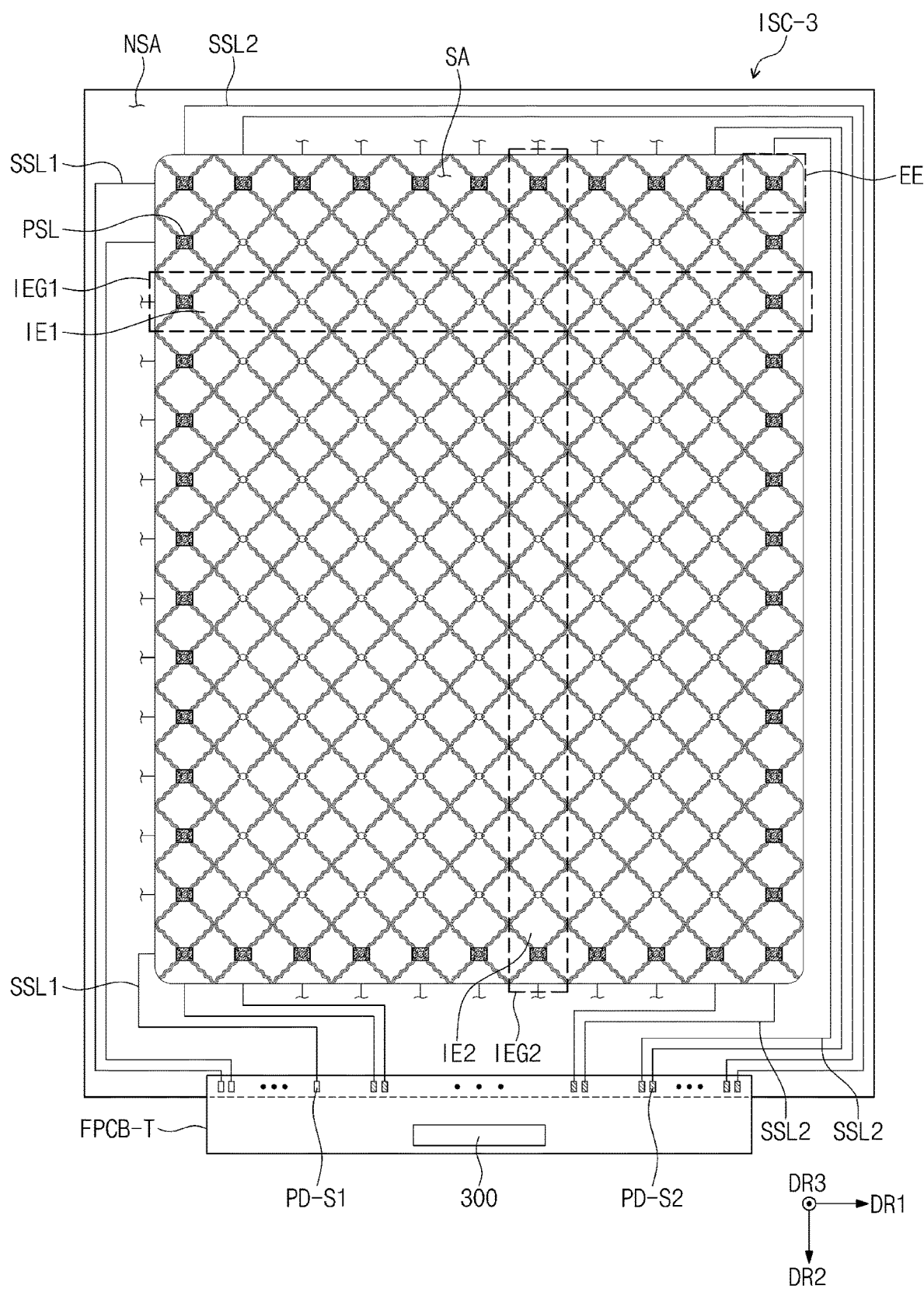
FIG. 17 is a plan view illustrating an input sensing circuit, according to an exemplary embodiment of the present invention.
Figure 18:
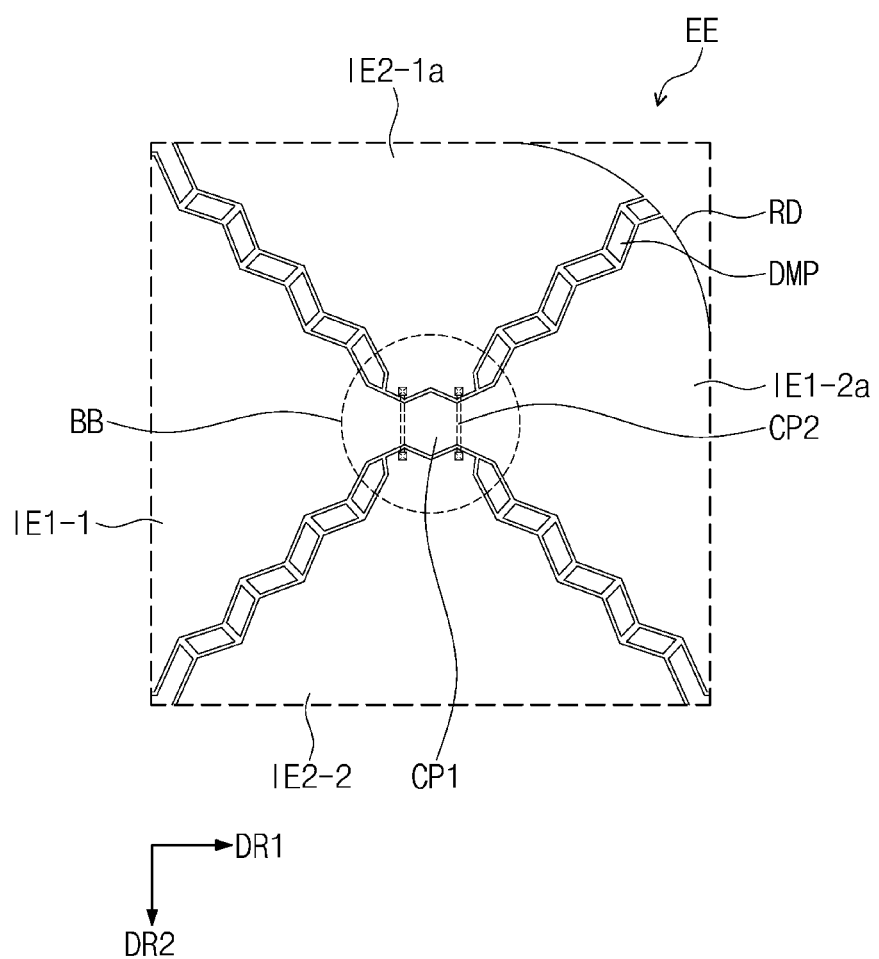
FIG. 18 is an enlarged view of portion EE of FIG. 17.

FIG. 17 is a plan view of an input sensing circuit ISC-3 according to an exemplary embodiment of the present invention. FIG. 18 is an enlarged view of portion EE of FIG. 17.

Referring to FIGS. 17 and 18, corners RD of the input sensing area SA of the input sensing circuit ISC-3 may have a rounded shape.

The corners RD of the input sensing area SA may respectively correspond to a boundary portion of the first sub-display surface DA-S1 and the third sub-display surface DA-S3 of the display device DD, a boundary portion of the second sub-display surface DA-S2 and the third sub-display surface DA-S3 of the display device DD a boundary portion of the first sub-display surface DA-S1 and the fourth sub-display surface DA-S4 of the display device DD, and a boundary portion of the second sub-display surface DA-S2 and the fourth sub-display surface DA-S4 of the display device DD.

According to an exemplary embodiment of the present invention, a display device that includes an input sensing unit capable of sensing a touch from a user and an applied pressure may be provided.

While the present invention has been described with reference to exemplary embodiments thereof, it will be apparent to those of ordinary skill in the art that various changes and modifications may be made thereto without departing from the spirit and scope of the present invention as set forth in the following claims.

What is claimed is:

1. An input sensing circuit comprising:
a base film;
a plurality of first sensors disposed on the base film;
a plurality of second sensors disposed on the base film;
an input sensing driver configured to sense a capacitance value between a first sensor of the plurality of first sensors and a second sensor of the plurality of second sensors;
a pressure sensing part in contact with the first sensor and the second sensor and including a synthetic resin and a conductive material;
a plurality of first connection parts, each of which electrically connects two first sensors adjacent to each other from among the plurality of first sensors; and
a plurality of second connection parts, each of which electrically connects two second sensors adjacent to each other from among the plurality of second sensors, each of the second connection parts being in direct contact with the base film,
wherein the pressure sensing part overlaps a first connection part of the plurality of first connection parts and a second connection art of the plurality of second connection parts when viewed on a plane, and
wherein the pressure sensing part is interposed between the first connection part and the second connection part when viewed in a cross-section.

2. The input sensing circuit, of claim 1, wherein, the first sensor and the second sensor are adjacent to each other, and
wherein when a pressure applied from the outside is equal to or greater than a predetermined value, the pressure sensing part electrically connects the first sensor and the second sensor disposed adjacent to each other, and
wherein, when the pressure applied from the outside is smaller than the predetermined value, the pressure sensing part electrically isolates the first sensor and the second sensor.

3. The input sensing circuit of claim 1, wherein the pressure sensing part is provided in plural, and
wherein the plurality of pressure sensing parts overlap sensors which are disposed on an outer side of the plurality of first sensors and the plurality of second sensors.

4. The input sensing circuit of claim 3, wherein the plurality of pressure sensing parts are disposed on the plurality of first sensors and the plurality of second sensors.

5. The input sensing circuit of claim 1, wherein each of the plurality of first sensors, the plurality of second sensors, the plurality of first connection parts, and the plurality of second connection parts includes indium tin oxide (ITO) or indium zinc oxide (IZO).

6. The input sensing circuit of claim 1, wherein a plurality of openings are disposed in each of the plurality of first sensors, the plurality of second sensors, the plurality of first connection parts, and the plurality of second connection parts.

7. The input sensing circuit of claim 1, wherein the plurality of first sensors are arranged in a first direction and extend in a second direction perpendicular to the first direction, and
wherein the plurality of second sensors are arranged in the second direction.

8. The input sensing circuit of claim 1, further comprising:
a first signal line that electrically connects the first sensor and the input sensing driver; and
a second signal line that electrically connects the second sensor and the input sensing driver,
wherein the input sensing driver determines whether a pressure has been applied, by detecting a signal received through the first signal line and the second signal line.

9. The input sensing circuit of claim 1, further comprising:
a first signal line that electrically connects the first sensor of the plurality of first sensors and the input sensing driver;
a second signal line that electrically connects the second sensor of the plurality of second sensors and the input sensing driver;

a first pressure sensing line that electrically connects the pressure sensing part and the input sensing driver; and a second pressure sensing line that is spaced apart from the first pressure sensing line and electrically connects the pressure sensing part and the input sensing driver.

10. A display device, comprising:

a main display surface parallel to a surface defined by a first direction and a second direction perpendicular to the first direction;

a first sub-display surface extending along a first side of the main display surface;

a second sub-display surface extending along a second side of the main display surface;

a third sub-display surface extending along a third side of the main display surface; and a fourth sub-display surface extending along a fourth side of the main display surface are defined;

a display panel including a plurality of light-emitting diodes; and an input sensing circuit disposed on the display panel, wherein, the input sensing circuit includes:

a plurality of sensors including a plurality of first sensors and a plurality of second sensors;

a pressure sensing part in contact with a first sensor of the plurality of first sensors and a second sensor of the plurality of second sensors, wherein the pressure sensing part includes a synthetic resin and a conductive material, and overlaps at least one of the first sub-display surface, the second sub-display surface, the third sub-display surface, and the fourth sub-display surface; and an input sensing driver configured to sense a capacitance value between the first sensor and the second sensor, wherein the input sensing circuit further includes:

a plurality of first connection parts, each of which electrically connects two first sensors adjacent to each other from among the plurality of first sensors; and a plurality of second connection parts, each of which electrically connects two second sensors adjacent to each other from among the plurality of second sensors, each of the second connection parts being in direct contact with a sensor base film, wherein the pressure sensing part is provided in plural, and each of the plurality of pressure sensing parts overlaps any one first connection part of the plurality of first connection parts and any one second connection part of the plurality of second connection parts when viewed on a plane, wherein the pressure sensing part is interposed between the first connection tart and the second connection part when viewed in a cross-section.

11. The display device of claim 10, wherein at least one of the first sub-display surface, the second sub-display surface, the third sub-display surface and the fourth sub-display surface is curved on a third direction perpendicular to the first direction and the second direction.

12. The display device of claim 10, wherein, when a pressure applied from the outside is equal to or greater than a predetermined value, the pressure sensing part electrically connects the first sensor and the second sensor, and wherein, when the pressure applied from the outside is smaller than the predetermined value, the pressure sensing part electrically isolates the first sensor and the second sensor.

13. The display device of claim 10, wherein the pressure sensing part is provided in plural and the plurality of pressure sensing parts are disposed on the plurality of first sensors and the plurality of second sensors.

14. The display device of claim 10, wherein a plurality of openings are disposed in each of the plurality of first sensors, the plurality of second sensors, the plurality of first connection parts, and the plurality of second connection parts, and wherein the plurality of openings overlap the plurality of light-emitting diodes.

15. The display device of claim 10, wherein the input sensing circuit further includes:

a first signal line that electrically connects the first sensor and the input sensing driver; and a second signal line that electrically connects the second sensor and the input sensing driver, wherein the input sensing: driver determines whether a pressure has been applied, by using a signal received through the first signal line and the second signal line.

16. The display device of claim 10, wherein the input sensing circuit further includes:

a first signal line that electrically connects the first sensor and the input sensing driver;

a second signal line that electrically connects the second sensor and the input sensing driver;

a first pressure sensing line that electrically connects the pressure sensing part and the input sensing driver; and a second pressure sensing line that is spaced apart from the first pressure sensing line and electrically connects the pressure sensing part and the input sensing driver, wherein the input sensing driver determines whether a pressure has been applied, by detecting a signal received through the first pressure sensing line or the second pressure sensing line.

* * * * *